(12) United States Patent
Nakamura

(10) Patent No.: US 6,642,114 B2
(45) Date of Patent: Nov. 4, 2003

(54) SEMICONDUCTOR DEVICE AND METHOD FOR FABRICATING THE SAME

(75) Inventor: Shunji Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 42 days.

(21) Appl. No.: 09/955,599

(22) Filed: Sep. 19, 2001

(65) Prior Publication Data

US 2002/0048886 A1 Apr. 25, 2002

Related U.S. Application Data

(62) Division of application No. 08/915,629, filed on Aug. 21, 1997, now Pat. No. 6,312,994.

(30) Foreign Application Priority Data

Jan. 29, 1997 (JP) .............................................. 9-15179

(51) Int. Cl.⁷ .......................................... H01L 21/336
(52) U.S. Cl. ...................... 438/279; 438/294; 438/618; 438/624; 438/634
(58) Field of Search ................................. 438/279, 289, 438/294, 585, 595, 598, 624, 618, 622, 626, 634, 639, 637, 638, 254, 701; 257/288, 296

(56) References Cited

U.S. PATENT DOCUMENTS

| | | | | |
|---|---|---|---|---|
| 4,240,195 A | | 12/1980 | Clemens et al. | 438/250 |
| 4,267,632 A | * | 5/1981 | Shappir | 438/257 |
| 4,973,562 A | | 11/1990 | Den Blanken | 148/DIG. 20 |
| 4,997,790 A | | 3/1991 | Woo et al. | 438/639 |
| 5,025,294 A | * | 6/1991 | Ema | 257/296 |
| 5,037,777 A | | 8/1991 | Mele et al. | 438/639 |
| 5,219,793 A | | 6/1993 | Cooper et al. | 438/634 |
| 5,292,677 A | | 3/1994 | Dennison | 438/396 |
| 5,296,400 A | | 3/1994 | Park et al. | 438/253 |
| 5,482,894 A | | 1/1996 | Havemann | 438/639 |
| 5,512,507 A | | 4/1996 | Yang et al. | 438/598 |
| 5,567,640 A | | 10/1996 | Tseng | 438/396 |
| 5,688,713 A | * | 11/1997 | Linliu et al. | 438/253 |
| 5,792,687 A | | 8/1998 | Jeng et al. | 438/253 |
| 5,807,779 A | | 9/1998 | Liaw | 438/279 |
| 5,866,927 A | * | 2/1999 | Cho et al. | 257/296 |
| 5,882,968 A | | 3/1999 | Jun | 438/254 |
| 5,899,739 A | * | 5/1999 | Ozaki | 438/624 |

* cited by examiner

Primary Examiner—Amir Zarabian
Assistant Examiner—Maria Guerrero
(74) Attorney, Agent, or Firm—Armstrong, Westerman & Hattori, LLP

(57) ABSTRACT

A method for fabricating a semiconductor device comprises the step of forming an interconnection 18 having the upper surface covered with an insulation film 20 on a base substrate 10, the step of sequentially depositing an insulation film 24 and an insulation film 26 on the base substrate 10 with the interconnection 18 formed on, the step of etching the insulation film 26 with the insulation film 24 as a stopper to form openings in a region containing a region where the interconnection 18 is formed, and the step of etching the insulation film 24 in the opening to form sidewall insulation films 30 of the insulation film 24 on the side walls of the interconnection 18 and form contact holes 34, 36 to be connected to the base substrate 10 in alignment with the interconnection 18.

11 Claims, 27 Drawing Sheets

SEMICONDUCTOR DEVICE AND METHOD FOR FABRICATING THE SAME

This application is a division of prior application Ser. No. 08/915,629, filed Aug. 21, 1997 now U.S. Pat. No. 6,312,994.

BACKGROUND OF THE INVENTION

The present invention relates to a method for fabricating a semiconductor device, and more specifically a semiconductor device including contact: holes in alignment with a base pattern and a method for fabricating the same.

As LSIs become larger-scaled, more micronization of devices is pursued.

To realize semiconductor integrated circuits including gates, interconnections and contact holes of more micronized dimensions, conventionally wavelengths of the exposure radiation for the photolithography have been made shorter to thereby improve resolving power.

While minimum resolved dimensions have been thus diminished, various device structures which decrease margins for alignment between lithography steps have been studied. In place of diminishing dimensions of patterns to be formed, dimensions of devices have been decreased.

As such structure, self-aligned contact (hereinafter called SAC), for example, is known.

The conventional SAC structure will be explained in comparison with a case including no SAC structure.

As shown in FIG. 24A, in a case that two gate electrodes 208 are formed on a silicon substrate 200, and an inter-layer insulation film 226 is formed on the gate electrodes 208, when a contact hole 228 is opened between the two gate electrodes 208 down to the silicon substrate 200, the gate electrodes 208 must be arranged, considering in advance alignment precision for opening the contact hole 228.

That is, gaps (a) between the contact hole 228 and the gate electrodes 208, which are larger than an alignment precision must be ensured so that when a conducting film is buried in the contact hole 228, the conducting film does not short-circuit with the gate electrodes 208 (FIG. 24B). Accordingly, a gap between the gate electrodes 208 is subject to the contact hole, which hinders further micronization.

In contrast to this, as shown in FIG. 24C, gate electrodes 208 are covered with an insulation film 230 having etching selectivity with the inter-layer insulation film 226. The insulation film 230 functions as an etching stopper in etching the inter-layer insulation film 226 to thereby protect the insulation film 232 (on the gate electrodes 208 and on the side walls) from excessive etching, so that the gate electrodes 208 are never exposed in the opening 228 by over-etching of the insulation film 232. Accordingly, a conducting film buried in the contact hole 228 is not short-circuited with the gate electrodes 208.

Thus, when disalignment occurs in the lithography step of forming the contact hole 228, an opening down to a silicon substrate 200, is defined only by the gate electrodes 208 and the insulation film 230, and even when the contact hole 228 is a little disaligned with the gate electrodes 208, the opening can be formed in a prescribed position (FIG. 24D). This enables the device to be micronized.

A method for fabricating the conventional semiconductor device including the SAC structure will be specifically explained by means of a structure of the cell array region of a DRAM with reference to FIGS. 25 and 26.

First, a device isolation film 202 is formed on a silicon substrate 200 by, e.g., the usual LOCOS method.

Then a gate insulation film 206 is formed in a device region 204 by, e.g., thermal oxidation.

Subsequently gate electrodes 208 are formed on the gate insulation film 206. Insulation films of, e.g., doped polycrystalline silicon film and silicon oxide film are continuously deposited by CVD, and the laid films are processed in the same pattern, and the gate electrodes 208 having the top surfaces covered with an insulation film 210 are formed (FIG. 25A).

Then, ions are implanted with the gate electrodes 208 as a mask to form in the device region an impurity-doped region 212 which is to be a low-concentration diffused layer of LDD structure.

Next, an insulation film 214 of, e.g., silicon oxide film is deposited on the entire surface (FIG. 25B).

Subsequently, the insulation film 214 is etched back by anisotropic etching to form sidewall insulation films 216 on the side walls of the gate electrodes 208.

Subsequently, ions are implanted with the gate electrodes and the sidewall insulation films as a mask to form an impurity doped region 218 which is to be a high-concentration diffused layer of LDD structure (FIG. 25C).

Then, the implanted impurity is activated by, e.g., a thermal treatment at 1000° C. for 10 seconds to form a source/drain diffused layers 220, 222 of LDD structure.

Then, an etching stopper film 224 of, e.g., silicon nitride film is deposited. The etching stopper film 224 is to be a protection film for protecting the base from being etched off when contact holes are opened in an inter-layer insulation film to be deposited on the etching stopper film 224.

Subsequently, an insulation film of, e.g., silicon oxide film is deposited and has the surface polished by, e.g., CMP (Chemical Mechanical Polishing) to form an inter-layer insulation film 226 having the surface planarized (FIG. 26A). The inter-layer insulation film 226 is formed of a material providing an etching selectivity with respect to the etching stopper film 224.

Subsequently, contact holes 228 opened on the source/drain diffused layers 220, 222 are formed.

When the contact holes 228 are etched, the inter-layer insulation film 226 is etched under conditions for etching the silicon oxide film, which can provide a sufficient selective ratio with respect to silicon nitride film, whereby even when parts of the contact holes 228 are extended over the gate electrodes 208, the etching stopper film 224 is not substantially etched.

Thus, the sidewall insulation films 216, and the insulation film 210 on the gate electrodes 208 are not excessively etched, and the contact holes can be stably opened.

Then, the etching stopper film 224 is etched to expose the source/drain diffused layers 220, 222 in the contact holes 228 (FIG. 26C).

In etching the etching stopper film 224 it is usual that anisotropic etching is not used, but wet etching in which the etching isotropically goes on is used. There are two reasons for this. One of the reasons is that the etching stopper film remaining as the sidewall insulation films narrow the contact regions, which increases contact resistance. The other of the reasons is to prevent the silicon substrate from being damaged by the anisotropic etching and having crystal defects.

The contact holes 228 are thus opened, whereby regions where the contact holes 228 are formed can overlap the gate electrodes 208, so that even when a resist pattern is a little disaligned by disalignment in the lithography step, the contact holes 228 can be opened in alignment with the gate electrodes 208 or the device isolation film 202.

As LSIs are higher integrated, new problems of the method for fabricating the above-described conventional semiconductor device have been made clear.

To attain higher integration of a semiconductor device it is necessary to form a larger number of transistors in a smaller region. The gap between the gate electrodes 208 is made smaller. In DRAMs, for example, the pattern size is about 0.7 times every generation, and is diminished by about ½ in two generations. On the other hand, to sufficiently function the etching stopper film 224 in the method for fabricating the semiconductor device shown in FIGS. 25 and 26, substantially the same film thickness as in the conventional semiconductor device is required.

When a semiconductor device is fabricated with these conditions satisfied, the contact region between the gate electrodes 208 is completely filled with the etching stopper film 224 (FIG. 27).

Here, to form the contact hole 228 in the contact region between the gate electrodes 208 it is necessary to remove the etching stopper film 224 filled in the contact region, but it is very difficult to remove the etching stopper film 224 in the contact region.

That is, to remove the etching stopper film buried in the contact region by the above-described wet etching, the etching stopper film has to be etched off by a film thickness corresponding to a height of the gate electrodes 208, but the etching stopper film below the inter-layer insulation film is also side-etched by substantially the same degree. Consequently, for example, the etching stopper film 224 on the gate electrodes 208 is completely etched, and a micronized pattern formed on the inter-layer insulation film 226 is often broken.

In removing the etching stopper film 224 by anisotropic etching, because an etching selectivity usable in wet etching cannot be ensured, the etching is carried on after the etching stopper film 224 on the side walls 216 is removed, to remove the etching stopper film 224 between the gate electrodes 208, and the sidewall insulation films 216 decrease a film thickness to expose, in some cases, the gate electrodes 208 in the contact hole 228. When the gate electrodes 208 are exposed in the contact hole 228, the gate electrodes 208 short-circuit with the source/drain diffused layers 220, 222, and the transistors often do not normally operate.

Also in completely etching off the etching stopper film of a height of the gate electrodes, to completely remove the etching stopper film it is necessary to a little over-etch in consideration of a disuniform film thickness of the inter-layer insulation film (a height of the gate electrodes), a disuniform etching amount, etc. This excessive etching amount is substantially proportional to a thickness of the insulation film. In a case that the etching stopper film is buried deep, the over-etching amount is accordingly increased. Accordingly in the conventional method the silicon substrate is unavoidably much damaged.

SUMMARY OF THE INVENTION

An object of the present invention is to provide a method for fabricating a semiconductor device relating to a contact hole opening technique and is suitable for further micronization of a semiconductor device.

The above-described object is achieved by the semiconductor device comprising: a semiconductor substrate; a device region defined by a device isolation film formed on the semiconductor substrate; a fist interconnection formed on the device region; an insulation film covering an upper surface and side walls of the first interconnection; an inter-layer insulation film formed on the semiconductor substrate with the insulation film formed on, and having an opening formed in a region including the device region; and a second interconnection formed, extended on the inter-layer insulation film and/or the insulation film, and connected to the device region in the opening. The semiconductor device of this structure facilitates forming micronized openings by loose rules for the lithography step.

In the above-described semiconductor device it is preferable that a plurality of the first interconnection are extended on the device region, and the second interconnection is connected to the device region between the first interconnections.

In the above-described semiconductor device it is preferable that the insulation film and the inter-layer insulation film have height substantially equal to each other, and the second interconnection is buried between the inter-layer insulation film and/or the insulation film.

The above-described object is achieved by a method for fabricating a semiconductor device comprising: a first interconnection forming step of forming a first interconnection having an upper surface covered with a first insulation film on a base substrate; an insulation film depositing step of sequentially depositing a second insulation film and a third insulation film on the base substrate with the first interconnection formed on; an opening forming step of etching the third insulation film with the second insulation film as a stopper to form an opening in a first region containing a region where the first interconnection is formed; and a contact hole forming step of etching the second insulation film in the opening to form sidewall insulation films of the second insulation film on the side walls of the first interconnection and form by self-alignment with the first interconnection a contact hole to be connected to the base substrate. According to the method for fabricating a semiconductor device, the second insulation film to be the etching stopper film is also the insulation film for the sidewall insulation films, which prevents the contact region for the gate electrodes from being filled with the second insulation film even in a case that the gate electrodes are spaced by a narrow gap.

According to the conventional method for fabricating a semiconductor device, two sidewall insulation films are formed between gate electrodes, and an etching stopper film is further formed on the side walls of the sidewall insulation films. To form an opening between gate electrodes, it is necessary to set an interval between the gate electrodes in consideration of their thickness, and an interval of at least a sidewall width×2+an etching stopper film thickness×2+α (contact size) must be ensured. However, according to the above-described method of the present application a width of twice an etching stopper film thickness (or twice a sidewall thickness) can be decreased. That is, the interval between the gate electrodes can be reduced to a sidewall width×2 (or an etching stopper film thickness×2)+α. Thus, the opening has an interior space allowance, which facilitates forming an opening of a narrow opening width.

A film forming the sidewall insulation films is the etching stopper film, which can decrease film forming steps and etching steps. This results in a shorter process and lower costs.

In the above-described method for fabricating a semiconductor device it is preferable that in the opening forming step, the opening bridges both regions on both side of the first interconnection, whereby it is not necessary to leave a micronized pattern on the gate electrodes, which enables rules for the lithography step to be loosened. The first opening formed over both sides of the first interconnection is divided into two or more smaller openings on the first interconnection. Thus smaller openings than drawing rules for forming an opening bridging regions both sides of the first interconnection can be formed without disalignment.

In the above-described method for fabricating a semiconductor device, it is preferable that the method further comprises, after the insulation film depositing step, an insulation film removing step of retreating a surface of the third insulation film to expose a part of the second insulation film on the first interconnection, whereby an opening bridging regions on both sides of the first interconnection is divided by the first interconnection, and two or more openings can be formed.

In the method for fabricating a semiconductor device, it is preferable that the method further comprises, after the contact hole forming step, a second interconnection forming step of forming a second interconnection buried in the opening and connected to the base substrate, whereby two or more interconnections connected to the base substrate through an opening and divided by the first interconnection can be formed.

In the above-described method for fabricating a semiconductor device it is preferable that in the second interconnection forming step, the second interconnection which contains an impurity, which donates to electric conductivity of the base substrate, is formed and the impurity dopes into the base substrate by diffusion from the second interconnection, whereby a shallow diffused layer can be easily formed directly below the second interconnection.

In the above-described method for fabricating a semiconductor device it is preferable that the method further comprises, prior to the first interconnection forming step, a device isolation film forming step of forming a device isolation film on the base substrate; and a device isolation film removing step of removing the device isolation film until a surface of a device region defined by the device isolation film has a height substantially equal to the device isolation film, whereby the second interconnection can be formed by self-alignment without being influenced by steps of the device isolation film.

In the above-described method for fabricating a semiconductor device it is preferable that the method further comprises, prior to the first interconnection forming step, a device isolation film forming step of forming a device isolation film on the base substrate; a first conducting film depositing step of depositing a first conducting film on the base substrate with the device isolation film formed on; and a conducting film burying step of polishing a surface of the base substrate with the first conducting film formed on until the device isolation film is exposed to bury the first conducting film in the device region defined by the device isolation film and planarize a surface of the base substrate, and wherein in the first interconnection forming step, the first conducting film under the first interconnection is processed in the substantially same pattern as the first interconnection, whereby steps of the device isolation film can be buried with the first conducting film, which enable the second interconnection to be formed by self-alignment without being influenced by the steps of the device isolation film.

In the method for fabricating a semiconductor device it is preferable that the method further comprises, prior to the first interconnection forming step, a device isolating step of forming a device isolation film on the base substrate, and wherein in the first interconnection forming step, the first interconnection is formed on the device region defined by the device isolation film and on the device isolation film; and in the insulation film removing step, the third insulation film is retreated until the second insulation film formed on the first interconnection on the device region is exposed, whereby the second interconnections can be formed by self-alignment without being influenced by steps of the device isolation film. That is, cavities formed by steps of the device isolation film do not interconnect the second interconnections, and the second interconnections divided by the first interconnections can be formed.

The above-described object is achieved by a method for fabricating a semiconductor device comprising: a device isolation film forming step of forming a device isolation film on a semiconductor substrate to define a plurality of device regions extended in a first direction and arranged in a staggered layout; a word line forming step of forming a plurality of word lines having surfaces covered with a first insulation film and extended in a second direction intersecting the first direction, two of the word lines being extended in each of the device regions; an insulation film depositing step of depositing a second insulation film on the semiconductor substrate with the word lines formed on; a resist pattern forming step of forming a resist pattern for covering regions which are between the device regions extended in the first direction and are between the two word lines intersecting the respective device regions and the word lines which are adjacent to the two word lines on the outsides of the two word lines, on the second insulation film on one sides of the respective device regions; and an opening forming step of etching the second insulation film with the resist pattern as a mask to form first openings extended from the respective device regions between the two word lines intersecting the respective device regions to the other sides of the respective device region, and second opening opened on the respective device regions between the adjacent word lines intersecting the different device regions. According to the method for fabricating a semiconductor device, the lithography step for opening the contact holes for leading the bit lines and the contact holes for leading the storage electrodes can have loosened rules.

In the above-described method for fabricating a semiconductor device it is preferable that the method further comprises a contact hole forming step of etching the first insulation film in the first openings and the second openings to form sidewall insulation films of the first insulation film on side walls of the word lines and contact holes connected to the semiconductor substrate by alignment with the word lines, whereby the openings for the contact holes for leading the bit lines from the semiconductor substrate, and the openings for the contact holes for leading the storage electrodes from the semiconductor substrate can be easily formed.

The above-described object can be achieved by a method for fabricating a semiconductor device comprising: a device isolation film forming step of forming a device isolation film on a semiconductor substrate to define a plurality of device regions extended in a first direction and arranged in a staggered layout; a word line forming step of forming a plurality of word lines having surfaces covered with a first insulation film and extended in a second direction intersecting the first direction, two of the word lines being extended in each of the device regions; an insulation film depositing step of depositing a second insulation film and a third insulation film on the semiconductor substrate with the word lines formed on; a planarization step of planarizing the third insulation film; a resist pattern forming step of forming a resist pattern for covering regions which are between the device regions extended in the first direction and are between the two word lines intersecting the respective device regions and the word lines which are adjacent to the two word lines on the outsides of the two word lines, on the third insulation film and on one sides of the respective device regions; an opening forming step of etching the third insulation film with the resist pattern as a mask to form first openings extended from the respective device regions between the two word lines to the other sides of the respective device regions, and second openings opened on the device regions between the adjacent word lines intersecting the different device regions; and a contact hole forming step of etching the second insulation film in the first openings and the second openings to form sidewall insulation films of the second insulation film on side walls of the word lines and to form contact holes to be connected to the semiconductor substrate in alignment with the word lines. According to the method for fabricating a semiconductor device, the openings for the contact holes for leading the bit lines from the semiconductor substrate, and the openings for the contact holes for leading the storage electrodes from the semiconductor substrate can be easily formed. The lithography for opening the contact holes does not require transferring a micronized contact hole pattern, which can simplify the lithography.

The above-described object is achieved by a method for fabricating a semiconductor device comprising: a word line forming step of forming a plurality of word lines extended in a first direction on a semiconductor substrate; a bit line forming step of forming a plurality of bit lines having upper surfaces covered with a first insulation film and extended in a second direction intersecting the first direction on the semiconductor substrate with the word lines formed on; an insulation film depositing step of depositing a second insulation film and a third insulation film on the semiconductor substrate with the bit lines formed on; a planarization step of planarizing a surface of the third insulation film; a resist pattern forming step of forming a striped resist pattern for alternately covering regions between the word lines on the planarized third insulation film; an opening forming step of etching the third insulation film with the resist pattern as a mask to open a plurality of openings in regions between the bit lines; and a contact hole forming step of etching the second insulation film in the openings to form side walls of the second insulation film on side walls of the bit lines and open contact holes to be connected to the semiconductor substrate in alignment with the bit lines. According to the method for fabricating a semiconductor device, the opening for the contact holes for leading the storage electrodes from the semiconductor substrate can be easily formed. The lithography for opening the contact holes does not require transferring a micronized contact hole pattern, which can simplify the lithography.

DETAILED DESCRIPTION OF THE INVENTION

[A First Embodiment]

The method for fabricating a semiconductor device according to first embodiment of the present invention will be explained with reference to FIGS. 1A–1C and 2A–2C.

FIGS. 1A–1C and 2A–2C are sectional views of the semiconductor device at the steps of the method for fabricating a semiconductor device according to the present embodiment.

First, an about 200 nm-thick device isolation film 12 is formed on a silicon substrate 10 by, e.g., the usual LOCOS method to define a device region 14.

Then, an about 5 nm-thick gate insulation film 16 is formed by, e.g., thermal oxidation.

Figure 1A:
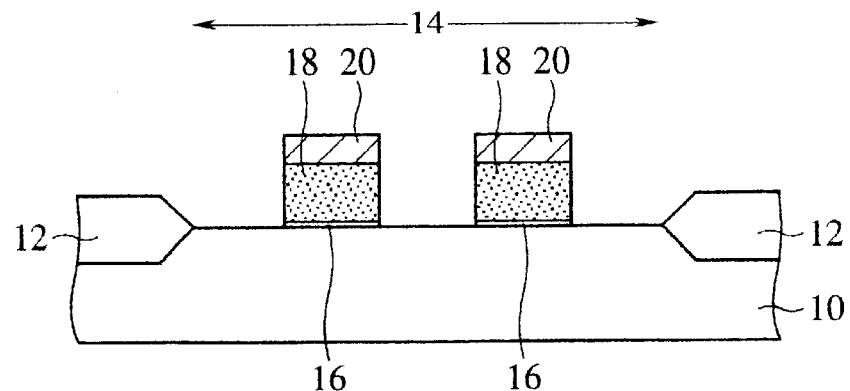
FIGS. 1A–1C are sectional views of a semiconductor device in the steps of the method for fabricating a semiconductor device according to a first embodiment of the present invention, which explain the method (Part 1).

Subsequently, gate electrodes 18 are formed on the gate insulation film 16. A doped polycrystalline silicon film of, e.g., an about 200 nm-thick and an insulation film of silicon oxide film are continuously deposited by CVD and processed in the same pattern by lithography and etching to form the gate electrodes 18 having the top surfaces of the gate electrodes 18 covered with an insulation film 20 (FIG. 1A).

Then, with the gate electrodes 18 as a mask ions are implanted to form in a device region an impurity-doped region 22 which is to be a low-concentration diffused layer of LDD structure. Ions of a Group V element, e.g., As (arsenic) or others, and ions of a Group III element, e.g., B (boron) or others are implanted in $5\times10^{13}$–$1\times10^{14}$ cm$^{-2}$ respectively in a case of an n-type transistor and in a case of a p-type transistor.

The impurity-doped region 22 is not essential in a case that a transistor structure, such as MOD (Minimum Overlapped source Drain) structure is applied. MOD structure is a method for ions are implanted with the sidewall insulation films formed on the side walls of the gate electrodes, and an impurity is thermally diffused down below the sidewall insulation films to thereby form a source/drain diffused layer.

Figure 1B:
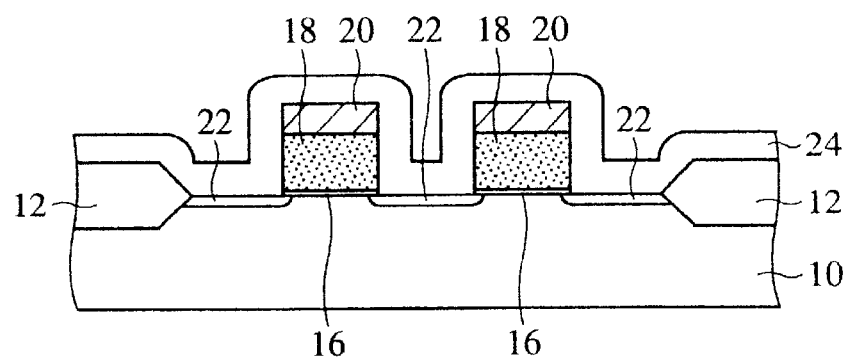

Next, an about 50–200 nm-thick silicon nitride film is deposited by, e.g., CVD to form an etching stopper film 24 (FIG. 1B).

The etching stopper film 24 is used as a stopper for etching the inter-layer insulation film in a later step, and as sidewall insulation films to be formed on the side walls of the gate electrodes 18. The etching stopper film 24 is not essentially silicon nitride film as long as the etching stopper film 24 can do these functions and may be formed of another film. For example, SiO$_2$ film, SiON film or alumina film may be used.

Subsequently an insulation film to be the inter-layer insulation film is deposited on the entire surface. The insulation film may be an insulation film deposited by CVD or SOG (Spin On Glass).

Figure 1C:
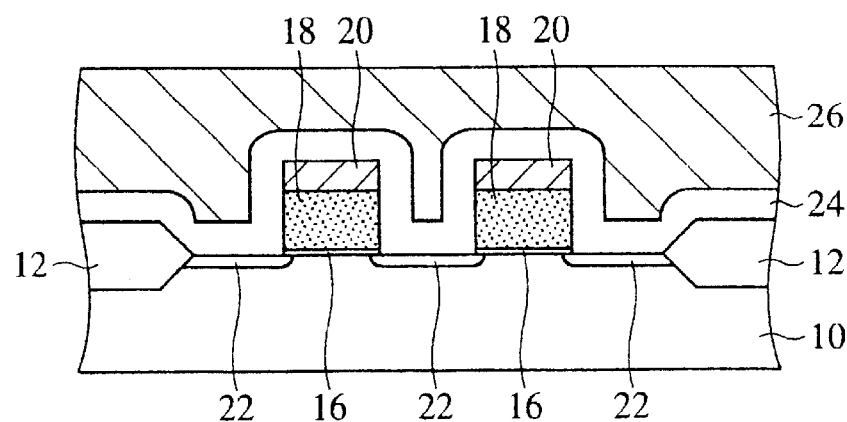

Subsequently, the surface of the insulation film is planarized to form the inter-layer insulation film 26 having the surface planarized (FIG. 1C). In a case that the insulation film is a film having a low melting point, such as BPSG film, the surface of the insulation film can be planarized by, e.g., a melting step. The surface of the insulation film may be planarized by CMP.

Then, a photoresist 28 having openings in regions where the source/drain diffused layer are to be formed is formed by the usual lithography.

Figure 2A:
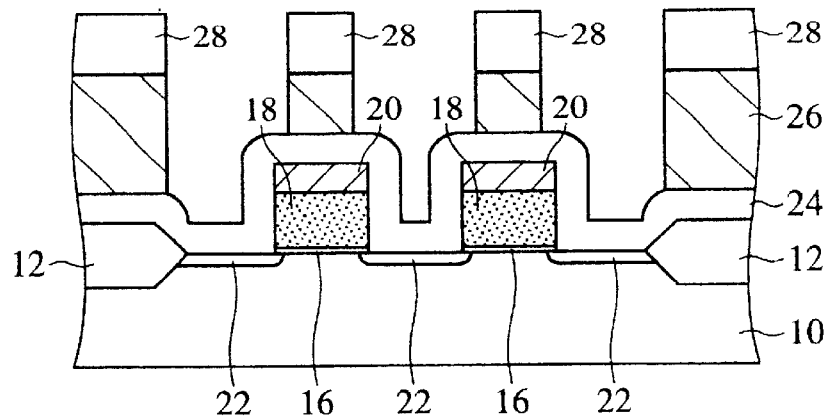
FIGS. 2A–2C are sectional views of a semiconductor device in the steps of the method for fabricating a semiconductor device according to the first embodiment of the present invention, which explain the method (Part 2).

Subsequently, anisotropic etching is conducted with the photoresist 28 as a mask to pattern the inter-layer insulation film 26 (FIG. 2A). Etching conditions which allow a large selective ratio between the inter-layer insulation film 26 and the etching stopper film 24 to enable the etching stopper film 24 to sufficiently function as the stopper are preferable. By using, e.g., RIE (Reactive Ion Etching) using C$_4$F$_8$, CO, Ar and O$_2$ gas, the inter-layer insulation film 26 is patterned substantially without etching the etching stopper film 24.

Then, the anisotropic etching is further conducted with the photoresist film 28 as a mask to pattern the etching stopper film 24 below the inter-layer insulation film 26. Because of the etching stopper film 24 deposited on the side walls of the gate electrodes 18 and the insulation film 20, even when the etching goes on until the silicon substrate 10 is exposed in the regions where the source/drain diffused layer are to be formed, the etching stopper film 24 on the side walls is not removed to remain as the sidewall insulation films 30.

Concurrently therewith, contact holes 34, 36 are opened in alignment with the gate electrodes 18 on the regions where the source/drain diffused layer is formed.

Figure 25A:
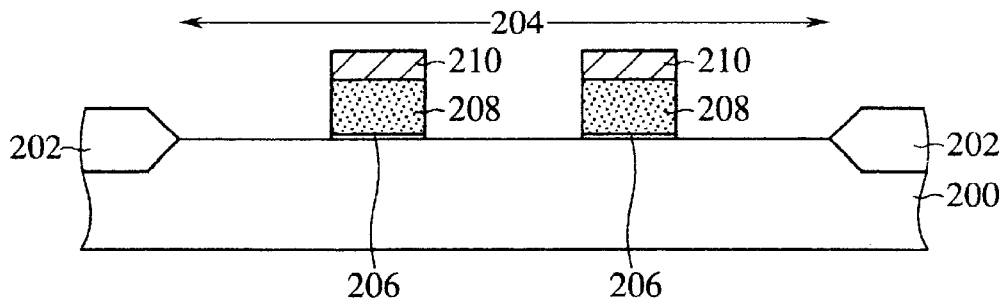
FIGS. 25A–25C are sectional views of a semiconductor device in the steps of a conventional method for fabricating a semiconductor device, which explain the method (Part 1).
Figure 25B:
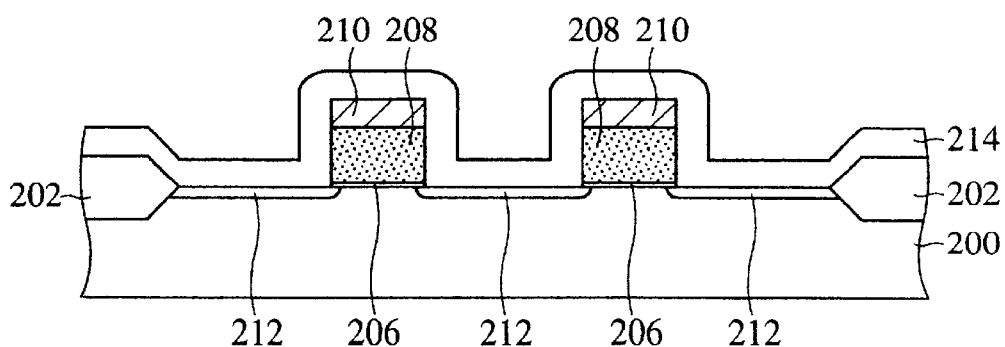
Figure 25C:
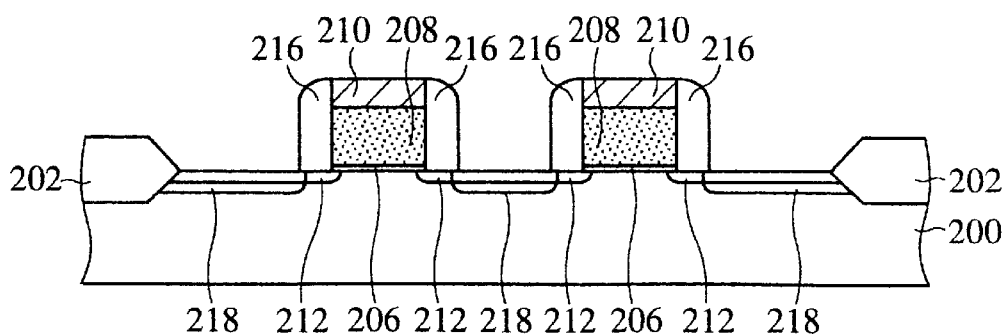
Figure 26A:
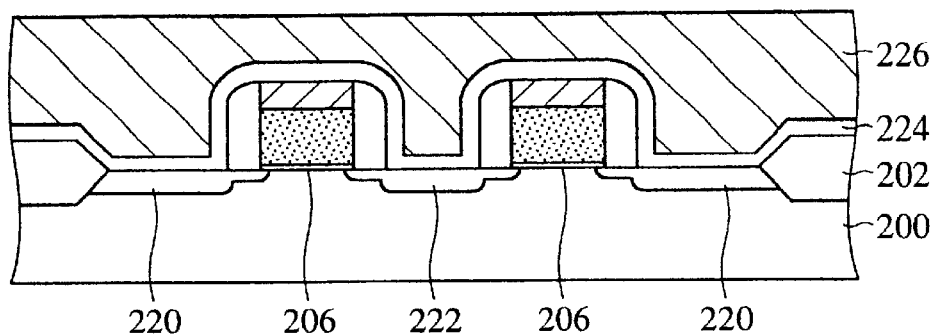
FIGS. 26A–26C are sectional views of a semiconductor device in the steps of a conventional method for fabricating a semiconductor device, which explain the method (Part 2).
Figure 26B:
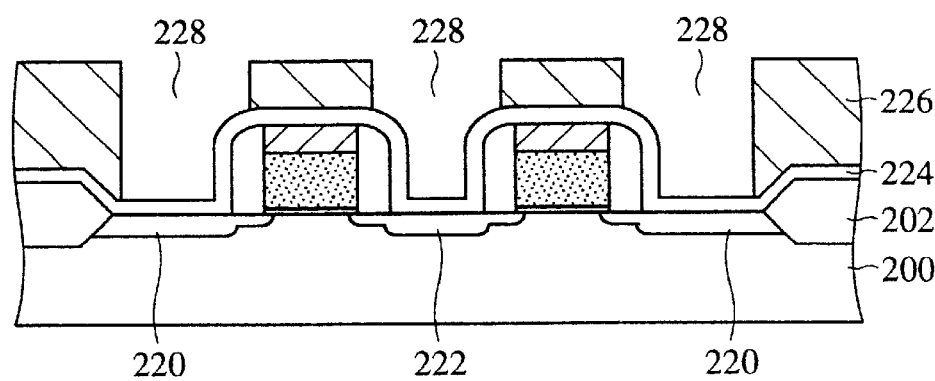
Figure 26C:
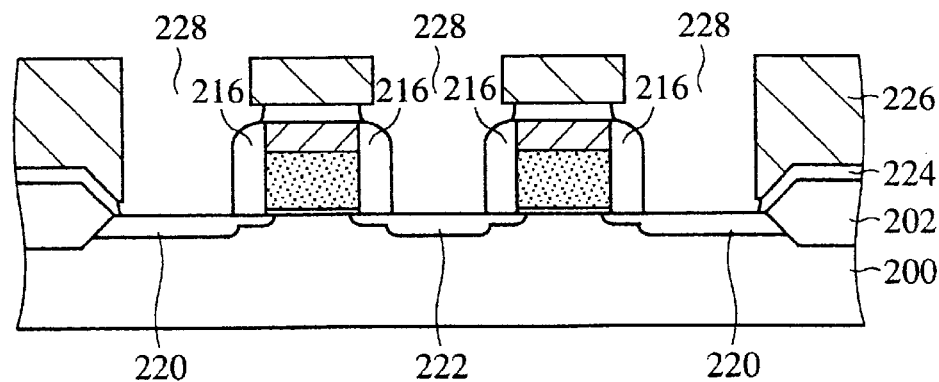
Figure 27:
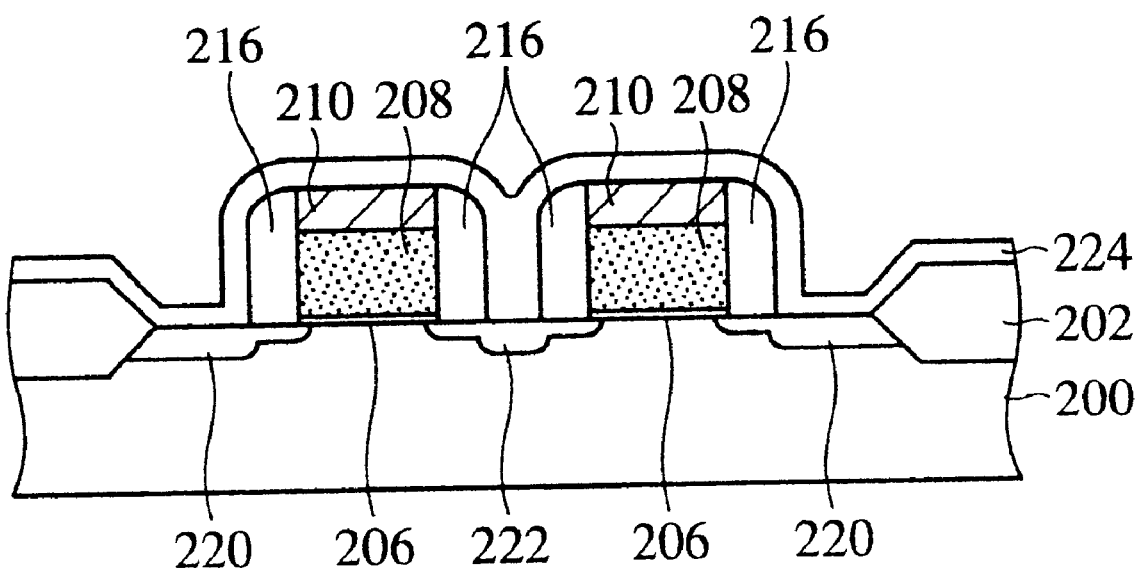
FIG. 27 is a view explaining the problem of the conventional method for fabricating a semiconductor device.

In the method for fabricating a semiconductor device according to the present embodiment, although anisotropic etching is used in etching the etching stopper film 24, a total number of RIE steps is not increased because the present embodiment does not include an another step of forming the sidewall insulation films as does the conventional method for fabricating a semiconductor device shown in FIG. 25, and the damages introduced into the silicon substrate by the RIEs are not increased.

By using RIE in etching the etching stopper film 24, no side-etching occurs in the etching stopper film 24, and accordingly more micronized semiconductor devices can be easily fabricated.

One insulation film functions as the insulation film and the stopper film (e.g., silicon nitride film) for forming the sidewall insulation films, whereby accordingly, the fabrication process can be simplified, and cost reduction can be achieved.

Figure 2B:
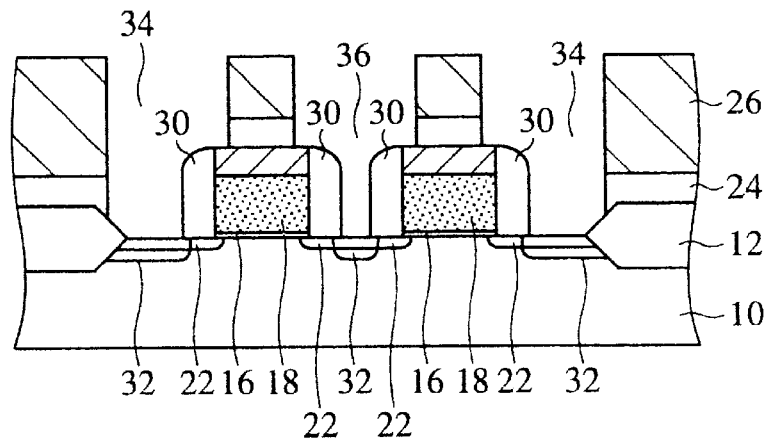
Figure 2C:
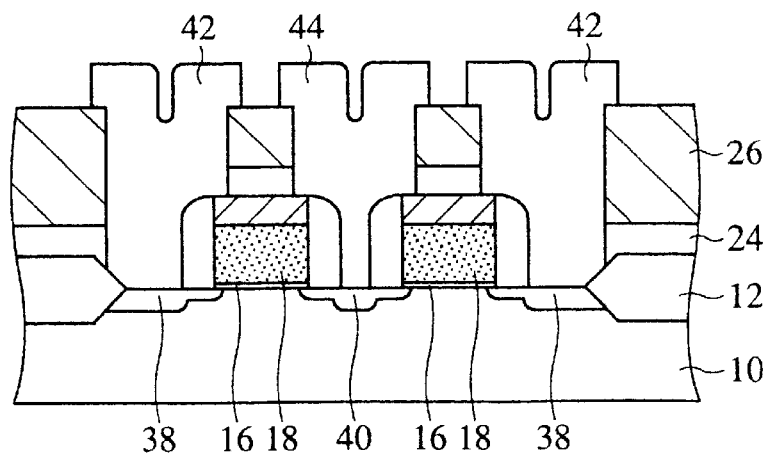

Then, ions are implanted with the gate electrodes 18 and the sidewall insulation films 30 as a mask to form in the device region impurity-doped regions 32 which are to be high-concentration diffused layers of LDD structure. Ions of a Group V element, e.g., As (arsenic), P (phosphorus) or others, and ions of a Group III element, e.g., B (boron) or others are implanted in an about $4\times10^{15}$ cm$^{-2}$ dose respectively in a case of a n-type-transistor and in a case of a p-type-transistor (FIG. 2B).

Subsequently, the substrate is thermal-treated under required conditions to make the implanted impurity ions electrically active. The impurity can be activated by, e.g., a rapid thermal annealing at 1000° and 10 seconds. Thus the source/drain diffused layer 38, 40 are formed.

Then, a conducting film is deposited on the entire surface and patterned to form electrodes 42, 44 connected to the source/drain diffused layer 38, 40.

As described above, according to the present embodiment, the sidewall insulation films 30 are formed of the etching stopper film 24 used in opening the contact holes 34, 36, whereby even in a case that the gate electrodes 18 are arranged at a narrow gap, the contact region between the gate electrodes 18 is never filled with the etching stopper film 24, which facilitates opening the contact holes.

In the present embodiment, the contact holes 34, 36 are formed on the device region but may be formed on the device isolation film 12. Otherwise the contact holes 34, 36 may be formed in portions which do not bridge the gate electrodes. It is preferable that the regions for the openings are to be formed in are suitably designed depending on a layout of a semiconductor device or a method for fabricating the same.

[A Second Embodiment]

A method for fabricating a semiconductor device according to a second embodiment of the present invention will be explained with reference to FIGS. 3A–3B and 4A–4D. The same members of the present embodiment as those of the method for fabricating a semiconductor device according to the first embodiment are represented by the same reference numbers not to repeat or to simplify their explanation.

Figure 3A:
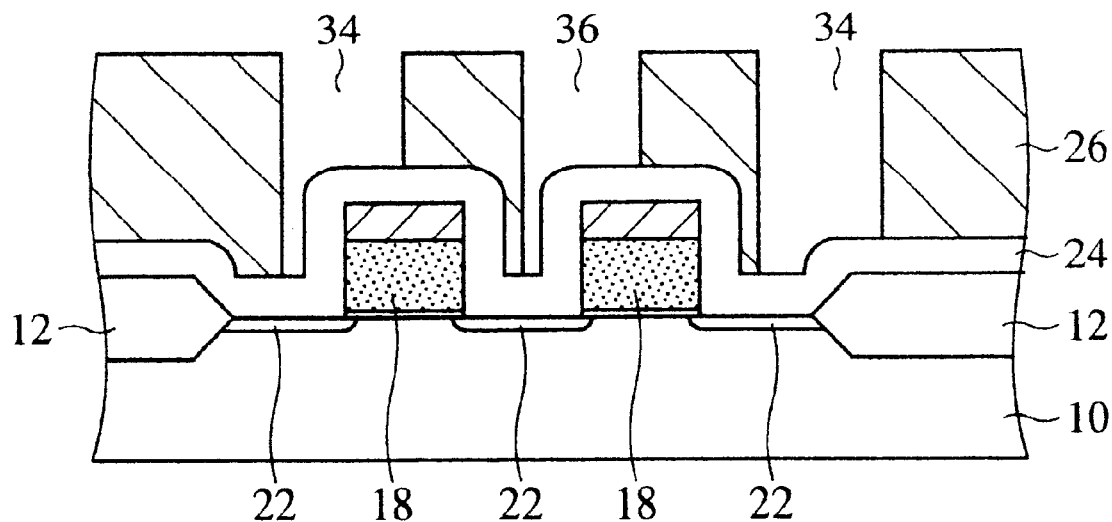
FIGS. 3A and 3B are views explaining the subject of the method for a semiconductor device according to the first embodiment.
Figure 3B:
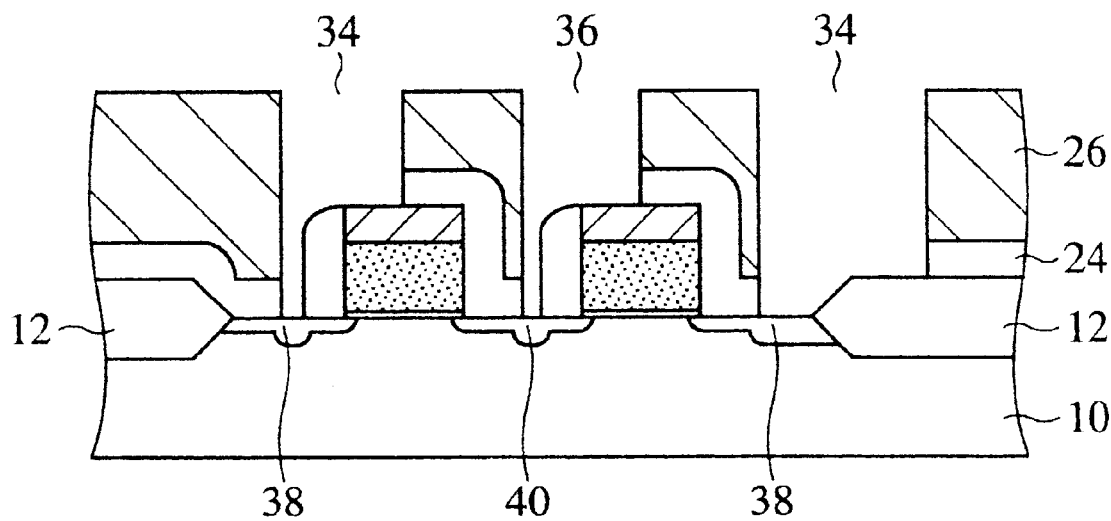

FIGS. 3A and 3B are views which explain the disadvantage of the method for fabricating a semiconductor device according to the first embodiment. FIGS. 4A–4D are sectional views of a semiconductor device at the steps of the method for fabricating the semiconductor device according to the present embodiment, which explain the method.

In the method for fabricating a semiconductor device according to the fist embodiment, the contact hole 34 and the contact hole 36 are opened on the source/drain diffused layer 38, 40, leaving the inter-layer insulation film 26 on the gate electrodes 18.

However, in a case that disalignment takes place in the lithography step of opening the contact holes 34, 36, and the patterned inter-layer insulation film 26 is extended over the regions to be the source/drain diffused layer 38, 40 (FIG. 3A), the low-concentration diffused region of LDD may be elongated with a result of higher parasitic resistance (FIG. 3B).

Consequently, a margin for disalignment in the lithography step for opening the contact holes must be small, which makes the patterning for the contact holes difficult.

On the other hand, to ensure a disalignment margin it is necessary to extend the contact holes 34, 36 sufficiently over the gate electrodes 18, but this makes a width of the inter-layer insulation film 26 remaining on the gate electrodes 18 extremely narrow, which makes the patterning of the contact holes 34, 36 difficult.

Although the method for fabricating a semiconductor device according to the first embodiment is an effective fabrication method because of it simple process, it has the risk that the above-described disadvantage in the lithography step may become serious as devices are increasingly micronized.

The method for fabricating a semiconductor device according to the present embodiment, can simplify the lithography step.

Figure 4A:
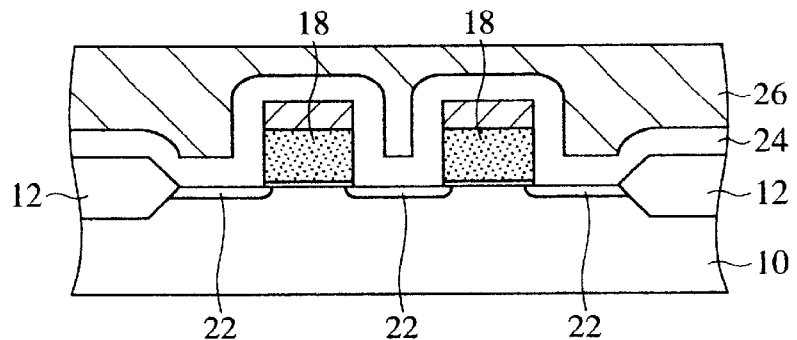
FIGS. 4A–4D are sectional views of a semiconductor device in the steps of the method for fabricating a semiconductor device according to a second embodiment of the present invention, which explain the method.

First, in the same way as the method for fabricating a semiconductor device according to the first embodiment exemplified in FIGS. 1A to 1C, gate electrodes 18, an etching stopper film 24 and an inter-layer insulation film 26 are formed (FIG. 4A).

Then, a photoresist 28 having an opening extended over regions for a source/drain diffused layer 38, 40 to be formed in is formed by the usual lithography. In the semiconductor device shown in FIGS. 4A–4D, the opening is formed over a region substantially equal to a device region 14 defined by a device isolation film 12 (preferably over a region larger than at least the device region by an alignment margin in consideration of disalignment in the lithography).

Figure 4B:
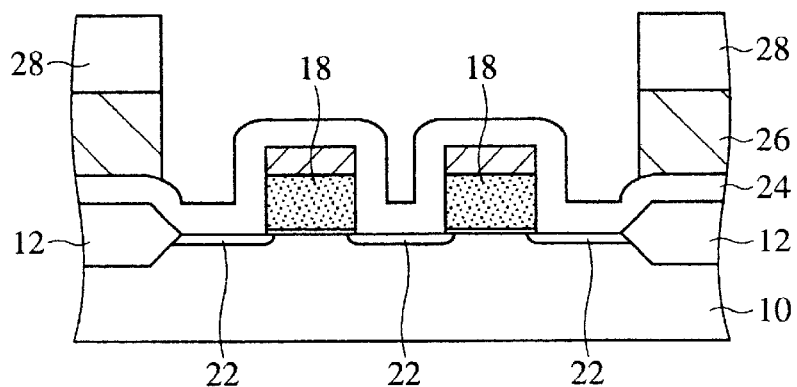

Subsequently, anisotropic etching is conducted with the photoresist 28 as a mask to pattern the inter-layer insulation film 26, whereby the inter-layer insulation film 28 does not remain on the gate electrodes 18 in the device region 14 (FIG. 4B).

Then, the photoresist 28 is removed, and the anisotropic etching is further conducted to pattern the etching stopper film 24 below the inter-layer insulation film 26. Because of the etching stopper film 24 deposited on the side walls of the gate electrodes 18 and the insulation film 20, when the etching goes on until the silicon substrate 10 is exposed in the regions for the source/drain diffused layer to be formed in, the etching stopper film 24 on the side walls is not removed to remain the sidewall insulation films 30.

Figure 4C:
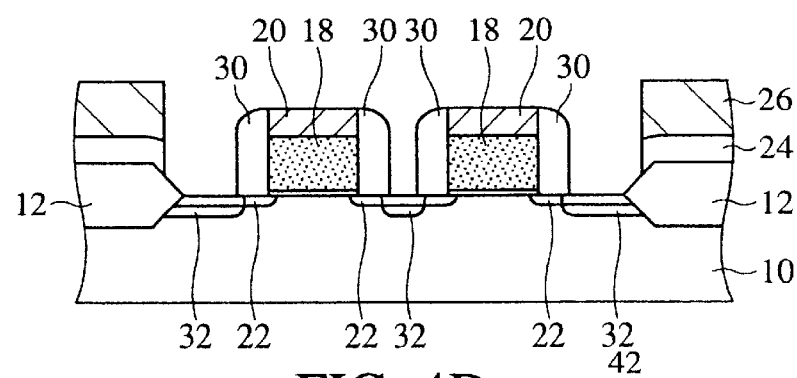

Then, ions are implanted with the gate electrodes 18 and the sidewall insulation films 30 as a mask to form in a device region an impurity-doped region 32 which is to be a high-concentration diffused layer of LDD structure. Ions of a Group V element, e.g., As (arsenic), P (phosphorus) or others and ions of a Group III element, e.g., B (boron) or others are implanted in an about $4 \times 10^{15}$ cm$^{-2}$ respectively in a case of a n-type-transistor and in a case of a p-type-transistor (FIG. 4C).

Subsequently, the substrate is thermal-treated under prescribed conditions to make the implanted impurity ions electrically active. The impurity can be activated by rapid thermal annealing at, e.g., 1000° C. for 10 seconds. Thus the source/drain diffused layer 38, 40 is formed in the device region.

Figure 4D:
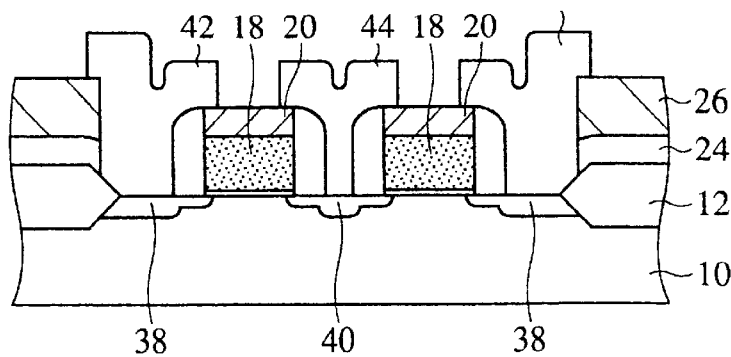

Then, a conducting film is deposited on the entire surface and patterned to form electrodes 42, 44 connected to the source/drain diffused layer 38, 40 (FIG. 4D).

As described above, according to the present embodiment, a contact hole extended over regions to be the source/drain diffused layer 38, 40 is formed, which allows rules of the lithography step for opening the contact hole to be less strict.

[A Third Embodiment]

The method for fabricating a semiconductor device according to a third embodiment of the present invention will be explained with reference to FIGS. 5A–5C and 6A–6B. The same members of the present embodiment as those of the method for fabricating a semiconductor device according to the first or the second embodiment are represented by the same reference numbers not to repeat or to simplify their explanation.

FIGS. 5A–5C and 6A–6B are sectional views of a semiconductor device in the steps of the method for fabricating a semiconductor device according to the present embodiment.

In the method for fabricating a semiconductor device according to the first or the second embodiment, the electrodes 42, 44 connected to the source/drain diffused layer 38, 40 are formed by pattering the conducting film deposited on the entire surface of the substrate.

In the method for fabricating a semiconductor device according to the above-described embodiment, however, because of a height difference between the surface of an inter-layer insulation film 26 and an insulation film 20, for higher resolution, a depth of focus becomes smaller, and a resolution becomes lower for a larger depth of focus. As a result, it is difficult to realize micronized lithography both in the surface of the inter-layer insulation film 20 and the surface of the insulation film 20.

The method for fabricating a semiconductor device according to the present embodiment facilitates patterning the electrodes 42, 44.

Figure 5A:
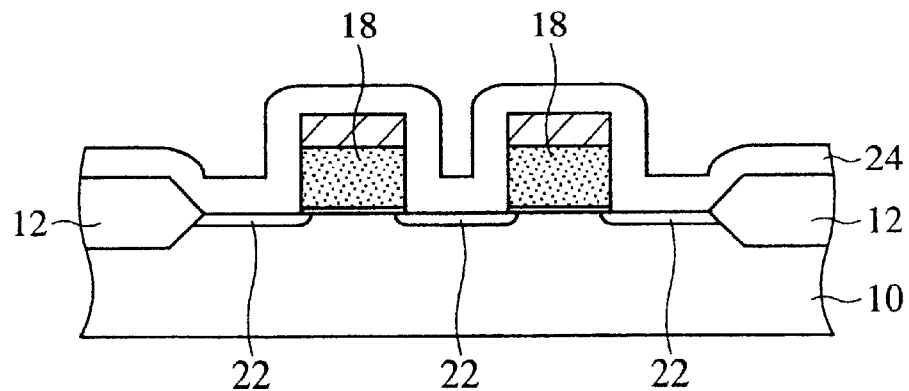
FIGS. 5A–5C are sectional views of a semiconductor device in the steps of the method for fabricating a semiconductor device according to a third embodiment of the present invention, which explain the method (Part 1).

First, in the same way as in the method for fabricating a semiconductor device according to the first embodiment exemplified in FIGS. 1A and 1B, gate electrodes 18 and an etching stopper film 24 are formed (FIG. 5A).

Figure 5B:
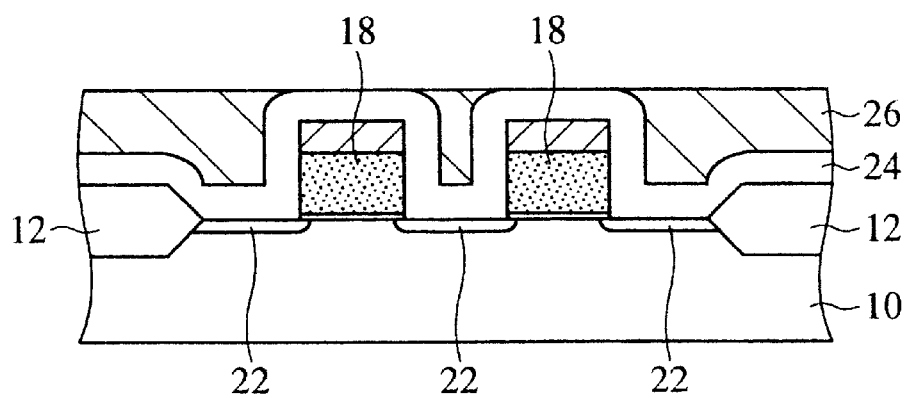

Next, an insulation film to be an inter-layer insulation film is deposited on the entire surface, and the surface is planarized by, e.g., CMP. At this time, the insulation film is polished with the etching stopper film 22 extended on the gate electrodes as a stopper to expose the etching stopper film 24 extended on the gate electrodes 18 on the surface. Thus the inter-layer insulation film 26 having the surface planarized is formed (FIG. 5B). In this step it suffices that the upper end of the etching stopper film 24 is exposed. Accordingly another planarization technique, such as etching back or others, may be used to cause the insulation film to retreat.

Subsequently, a photoresist 28 having an opening spanning regions to be a source/drain diffused layer 38 and regions to be a source/drain diffused layer 40 is formed by the usual lithography.

Figure 5C:
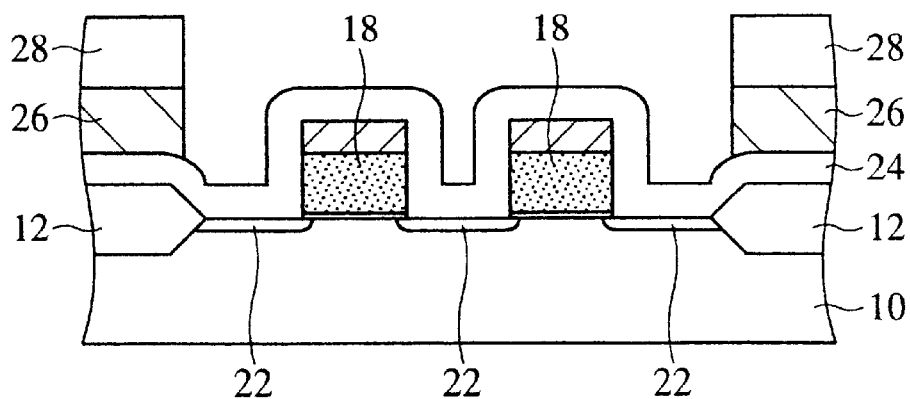

Then, anisotropic etching is conducted with the photoresist 28 as a mask to pattern the inter-layer insulation film 26. Thus the inter-layer insulation film 26 does not remain on the gate electrodes 18 in the device region 14 (FIG. 5C).

Next, the photoresist 28 is removed, and the anisotropic etching is further conducted. This anisotropic etching is conducted preferably under conditions which permit the inter-layer insulation film 26 and the etching stopper film 24 to be etched at substantially the same etching rate. For example, RIE using $C_4F_8$, Ar and $O_2$ gas permits etching rates of the etching stopper film 24 and the inter-layer insulation film 26 to be substantially equal to each other.

By this etching, sidewall insulation films 30 of the etching stopper film 24 are formed on the side walls of the gate electrodes 18 and the insulation film 20. On the other hand, the inter-layer insulation film 26 is etched by a film thickness substantially equal to a film thickness of the etching stopper film 24, and the inter-layer insulation film 26 has a height substantially equal to a height of the insulation film 20 exposed on the surface. Thus, contact holes 34, 36 can be opened with the surface maintained plane.

Figure 6A:
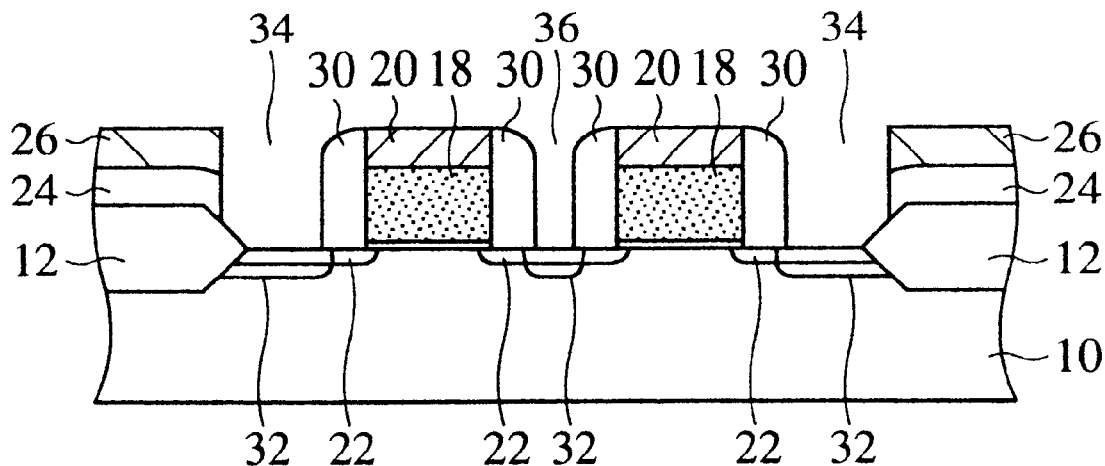
FIGS. 6A and 6B are sectional views of a semiconductor device in the steps of the method for fabricating a semiconductor device according to the third embodiment of the present invention, which explain the method (Part 2).

Subsequently, ions are implanted with the gate electrodes 18 and the sidewall insulation films 30 as a mask to form impurity-doped regions 32 to be high-concentration diffused layer of LDD structure in the device region. Ions of a Group V element, e.g., As (arsenic) or others, and ions of a Group III element, e.g., B (boron) are implanted in a $4\times10^{15}$ cm$^{-2}$ dose respectively in a case of an n-type transistor and in a case of a p-type transistor (FIG. 6A).

Then, the substrate is thermal-treated under prescribed conditions to make the implanted impurity ions electrically active. The impurity ions can be activated by rapid thermal annealing, e.g., at 100° C. for 10 seconds. Thus, the source/drain diffused layer 38, 40 is formed in the device region.

Figure 6B:
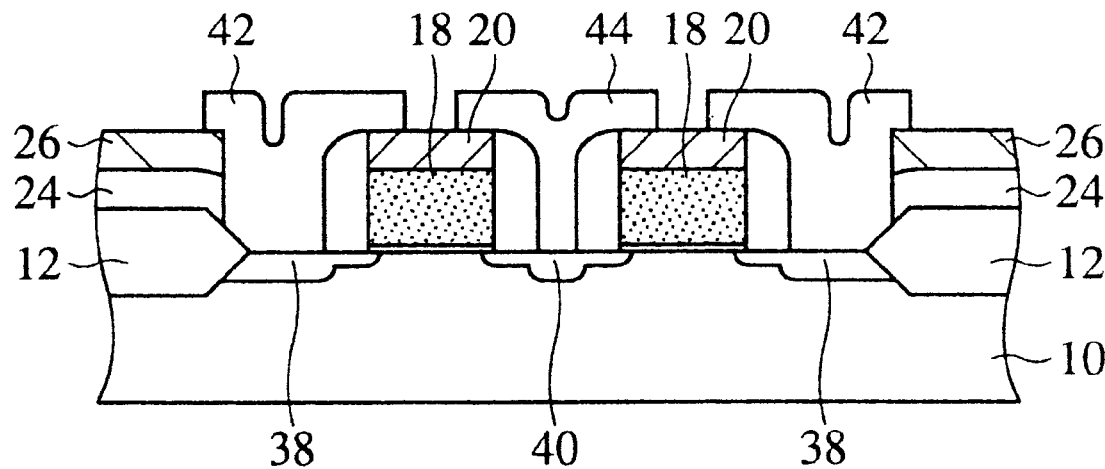

Next, a conducting film is deposited on the entire surface and patterned to form electrodes 42, 44 connected to the source/drain diffused layer 38, 40 (FIG. 6B). In this patterning, the surface of the inter-layer insulation film 26 and that of the insulation film 20 are on substantially the same level, and accordingly can be finely patterned without the problem of the depth of focus.

As described above, according to the present embodiment, the inter-layer insulation film 26 is planarized with the etching stopper film 24 to be the sidewall insulation films 30 as a stopper, and the contact holes are opened with the surface maintained plane, which permits the electrodes 42, 44 to be finely patterned.

[A Fourth Embodiment]

The method for fabricating a semiconductor device according to a fourth embodiment of the present invention will be explained with reference to FIGS. 7A and 7B. The same members of the embodiment as the method for fabricating a semiconductor device according to the first to the third embodiments are represented by the same reference numbers not to repeat or to simplify their explanation.

Figure 7A:
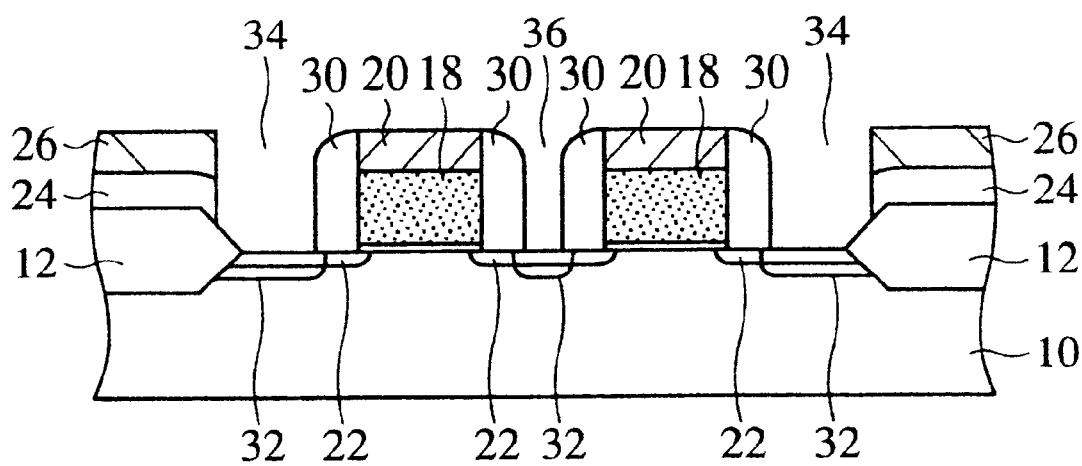
FIGS. 7A and 7B are sectional views of a semiconductor device in the steps of the method for fabricating a semiconductor device according to a fourth embodiment of the present invention, which explain the method.
Figure 7B:
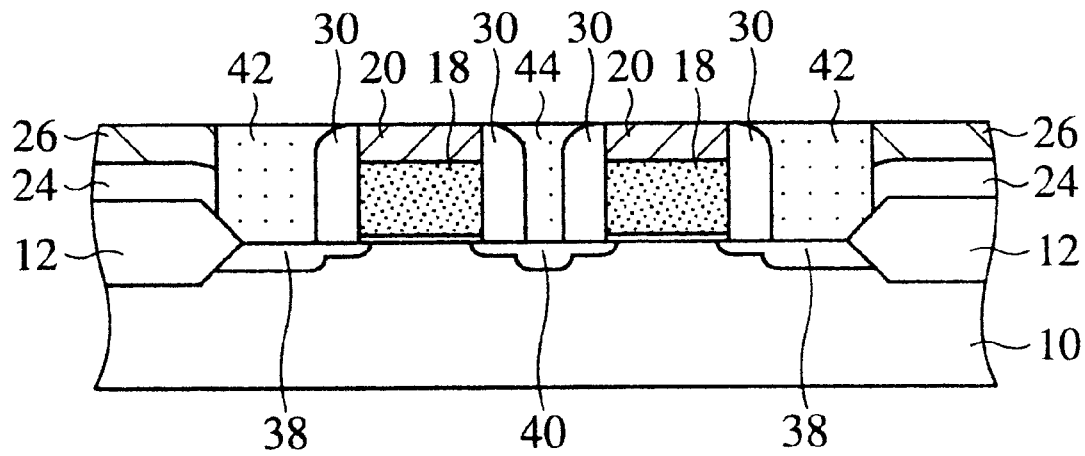

FIGS. 7A and 7B are sectional views of a semiconductor device in the steps of the method for fabricating a semiconductor device according to the present embodiment, which explain the method.

In the method for fabricating a semiconductor device according to the third embodiment, the electrodes 42, 44 are formed on the planarized surface of the substrate to thereby enable the electrodes 42, 44 to be finely patterned. As a device is further micronized, the device has a smaller gate length and a smaller gate gap, which makes a patterning to isolate the electrodes 42, 44 on the gate electrodes 18 difficult.

The method for fabricating a semiconductor device according to the present embodiment permits the electrodes 42, 44 to be patterned free from restriction by lithographical processing precision.

First, in the same way as in the method for fabricating a semiconductor device shown in FIGS. 5A to 6A, an inter-layer insulation film 26 with contact holes 34, 36 opened in regions where a source/drain diffused layer 38, 40 is to be formed is formed. The inter-layer insulation film 26 has a height substantially equal to a height of an insulation film 20 exposed on the surface (FIG. 7A).

Then, a conducting film to be electrodes is deposited on the entire surface. An electrode material can be a various material, e.g., aluminium, titanium (Ti), titanium nitride (TiN), gold (Au), metal silicide or others, or films of their compounds. An electrode material may be a material, e.g., polycrystalline silicon film, which is not conductive at the time of deposition but can be made conductive by later ion implantation or thermal treatment.

Subsequently, the conducting film is left only in the contact holes by CMP or back-etching (FIG. 7B). At the time it should be noted that the inter-layer insulation film 26 and the insulation film 20 have substantially the same height, and the region except the contact holes is substantially plane.

This is because in burying the conducting film by CMP, unless the surface is plane, the electrode material remain in cavities except the contact regions with a resultant risk that the electrodes, which should be insulated from each other, may be short-circuited, and in burying the conducting film the back-etching, the conducting film remains as sidewalls on steps with a resultant risk of the above-described short-circuit.

Thus, a height of the inter-layer insulation film 26 and that of the insulation film 20 are made substantially the same, and the region except the contact holes is substantially made plane, whereby the electrodes 42, 44 connected to the source/drain diffused layer 38, 40 can be formed by self-alignment.

As described above, according to the present embodiment, the inter-layer insulation film 26 is planarized with the etching stopper film 24 to be sidewall insulation films 30 as a stopper, and the contact holes are opened with the surface maintained plane, which permits the electrodes 42, 44 connected to the source/drain diffused layer 38, 40 to be formed by self-alignment.

In the above-described embodiments, the source/drain diffused layer 38, 40 is formed by ion implantation using the gate electrodes 18 and the sidewall insulation films 30 as a mask, but can be also formed by suitably selecting the conducting film of the electrodes 42, 44 to obtain thermal diffusion from the electrodes 42, 44 for forming the source/drain diffused layer 38, 40.

The electrodes 42, 44 are formed of the conducting film of a material having a large dopant impurity diffusion coefficient, e.g., a polycrystalline silicon, an amorphous silicon, a metal silicide, such as WSi, TiSi, CoSi or others and doped, and then are subjected to a suitable thermal-treatment to diffuse the dopant impurity from the electrodes 42, 44 into the silicon substrate to thereby form the source/drain diffused layer 38, 40. The impurity in the conducting film may be introduced at the time of forming the conducting film.

Thus forming the source/drain diffused layer 38, 40 by the thermal diffusion is suitable in comparison with the ion implantation in which an impurity is introduced into a substrate deep by an average projected range, to form a shallow diffused layer.

It is a very important technique to form shallow diffused layers in micronized MOS transistors, etc., but actually the technique cannot be easily realized. However, by the use of the method for fabricating a semiconductor device, the electrodes 42, 44 can be formed by self-alignment, and concurrently therewith a shallow diffused layer can be formed, whereby the method for fabricating a semiconductor device can have a simple process and can fabricate a semiconductor device having improved characteristics.

In forming the source/drain diffused layer by the above-described technique, it is essential to form the openings for the source/drain diffused layer by self-alignment with the gate electrodes. This is because when a distance between the openings in the source/drain diffused layer, and the ends of the gate electrodes varies, a channel region and the source/drain diffused layer are not perfectly connected with each other, with a resultant risk that the resistance between the source and the drain may become higher, or the source and the drain may be disconnected from each other.

By the self-aligned contact hole forming technique of the present invention, the openings in the source/drain diffused layer can be formed by self-alignment with the gate electrodes, and thus the technique is very effective in forming shallow junction.

In forming the source/drain diffused layer of LDD structure by the above-described technique, a low-concentration diffused layer is formed before forming the etching stopper film 24, and the high-concentration diffused layer is formed by diffusion from the electrodes 42, 44. It is also possible that an MOD transistor is formed, and the source/drain diffused layer is formed only by thermal diffusion from the electrodes 42, 44.

In a case that the electrodes 42, 44 are formed of polycrystalline silicon film or others which is made conductive by introduction of an impurity it is necessary that separately from the introduction of an impurity into the source/drain diffused layer, an impurity is introduced also into the electrodes 42, 44 to make the polycrystalline silicon film conductive. Especially, in a case that a CMOS circuit is formed, because the source/drain diffused layer of the p-type transistor is p-type, and the source/drain diffused layer of the n-transistor is n-type, it is necessary that the electrodes 42, 44 as well are made respectively p-type and n-type corresponding thereto. For this end, two lithography steps and ion implanting steps for implanting ions into the source/drain diffused layer are necessary, and two lithography steps and ion implanting steps for implanting ions into the electrodes 42, 44 are necessary.

On the other hand, because by the use of the method according to the present embodiment, in which, as described above, the source/drain diffused layer 38, 40 is formed by thermal diffusion from the electrodes 42, 44, two lithography steps and ion implanting steps for implanting ions into the source/drain diffused layer are unnecessary, and the method according to the present embodiment can delete even four steps in comparison with the conventional fabrication method.

In a case that the electrodes 42, 44 are formed of amorphous silicon film or polycrystalline silicon film, a silicide layer may be selectively formed on the electrodes 42, 44. The silicide film can be formed by burying the electrodes 42, 44 in the contact holes 34, 36 and then depositing a metal film on the entire surface and heat-treating the same, and removing that of the metal film which has not reacted.

Commonly in a semiconductor device with a high-speed logic mounted on, the top of the source/drain diffused layer is silicidized by self-alignment for reduced diffused layer resistances. On the other hand, in DRAMs, the so-called salicide process is not generally used although the salicide process is effective to reduce parasitic resistance to attain high speed and low electric power consumption from the viewpoint that pn junction leak current due to metals contained in the silicide is reduced to improve refresh characteristics.

However, it is recently required that a DRAM and a high speed logic must be mounted together. How to meet both requirements is a problem. As one means for solving this problem, only a cell region of the DRAM is covered in advance with an oxide film, and only the logic region is silicidized, but this means is not preferable in increased number of fabrication steps.

By applying the above-described structure having the tops of the electrodes 42, 44 silicidized, the silicide surface is lifted by an amount of the electrodes 42, 44 in comparison with the conventional method for silicidizing the surface of the source/drain diffused layer, and the pn junction of the source/drain diffused layer and the silicide layer can be accordingly spaced from each other. Accordingly the pn junction is less affected by metal contamination of the silicide layer, and junction leak current can be much reduced.

By applying the structure having the tops of the electrodes 42, 44 silicidized, the DRAM region can be silicidized concurrently with silicidation of thee high-speed logic region without increasing leak current in the DRAM cell region, whereby a semiconductor device having higher speed and smaller electric power consumption can be fabricated without adding to fabrication steps.

In comparison with the conventional method, connection resistance is increased by the silicide layer formed through the electrodes 42, 44, but affection of the connection resistance can be minimized by lowering the electrodes 42, 44.

The method of silicidizing the tops of the electrodes 42, 44 is applicable to structures other than the self-aligned contacts described in the present specification.

[A Fifth Embodiment]

The method for fabricating a semiconductor device according to a fifth embodiment of the present invention will be explained with reference to FIGS. 8A–8C. The same members of the present embodiment as those of the method for fabricating a semiconductor device according to the first to the fourth embodiments are represented by the same reference numbers not to repeat or to simplify their explanation.

Figure 8A:
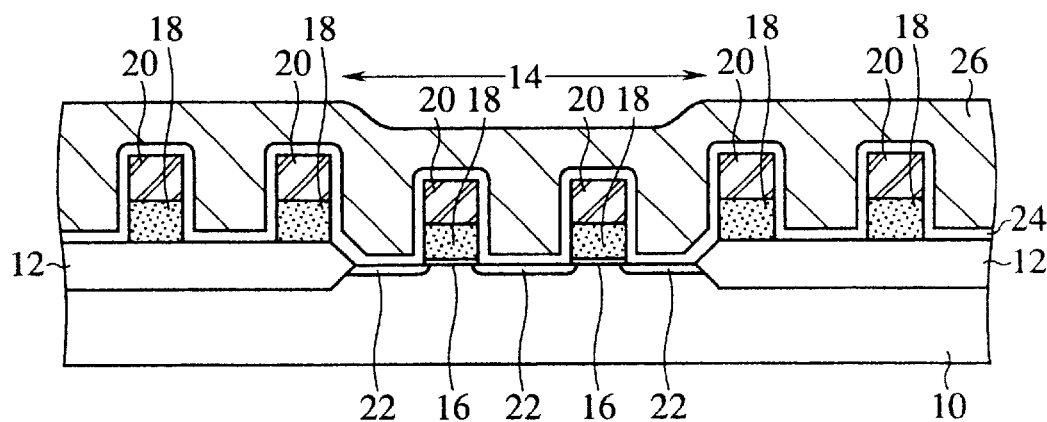
FIGS. 8A–8C are sectional views of a semiconductor device in the steps of the method for fabricating a semiconductor device according to a fifth embodiment of the present invention, which explain the method.
Figure 8B:
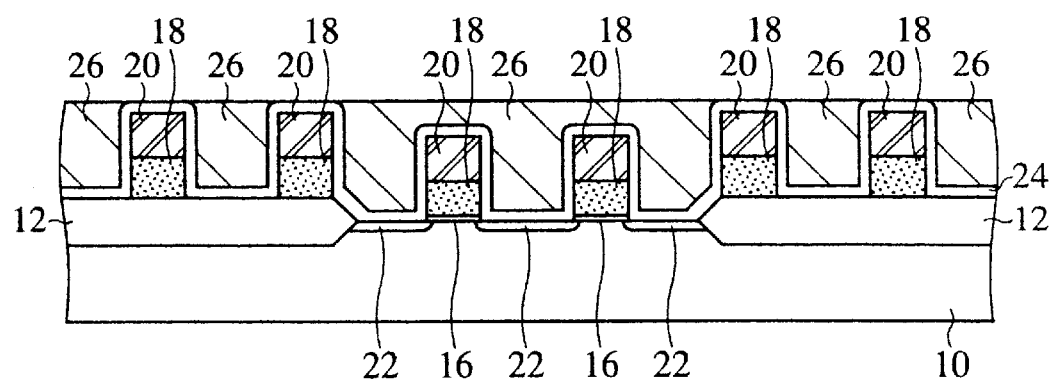
Figure 8C:
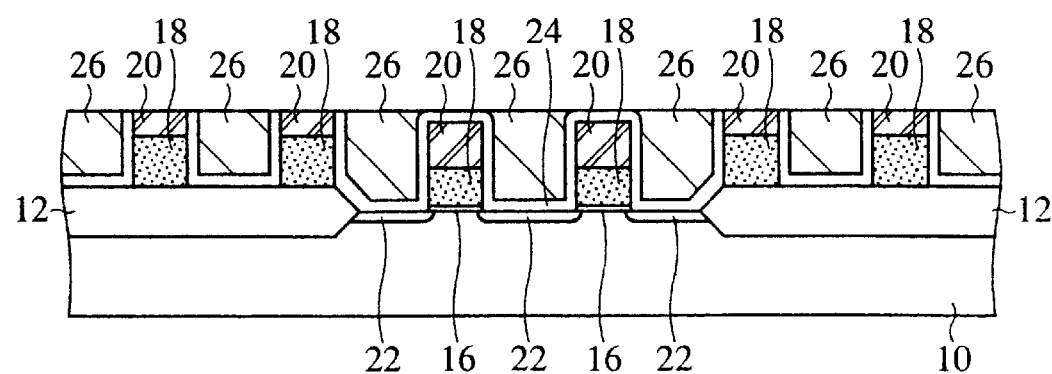

FIGS. 8A–8C are sectional views of a semiconductor device of the present embodiment in the steps of the method for fabricating a semiconductor device, which explain the method.

In the method for fabricating a semiconductor device according to the third and the fourth embodiments, the surface of the inter-layer insulation film 26 and the surface of the insulation film 20 are substantially uniform, whereby the fabrication process is simplified.

However, the gate electrodes 18 are formed over the device isolation film 12, and generally a height of the insulation film 20 formed on the gate electrodes is not uniform in plane of the wafer.

The method for fabricating a semiconductor device according to the present embodiment can overcome a step in the device isolation region formed by the method for fabricating a semiconductor device according to the third and the fourth embodiments.

First, in the same way as in the method for fabricating a semiconductor device according to, e.g., the first embodiment shown in FIGS. 1A to 1C, an insulation film to be an inter-layer insulation film 26 is deposited on a silicon substrate 10 with gate electrodes 18 formed on (FIG. 8A).

Then, the insulation film is polished by CMP until an etching stopper film 22 on the gate electrodes 18 in the device isolation region is exposed (FIG. 8B).

Subsequently, the insulation film is further polished by CMP until an etching stopper film 24 on the gate electrodes 18 in the device region 14 is exposed. At this time, the etching stopper film 22 and the insulation film 20 on the gate electrodes 18 in the device isolation region are concurrently polished, and when the etching stopper film 22 on the gate electrodes 18 in the device region 14 is exposed, the surface of the silicon substrate is substantially planarized (FIG. 8C).

The polishing can be stopped at a prescribed position by making test experiments in advance with the polishing period of time varied to give an optimum polishing period of time, and conducting the polishing for the optimum polishing period of time. To stop the polishing at a prescribed position, an end point detecting method in which wavelengths of polishing noises generated in the polishing are analyzed to detect the end point where a material quality of the polished surface is changed can be used.

Here, the insulation film 20 on the gate electrodes 18 must cover the entire gate electrodes 18 even after the polishing is stopped, and preferably a thickness of the insulation film 10 is suitably determined in consideration of a film thickness of the device isolation film, etc.

Then, a semiconductor device is fabricated in the same way as in the method for fabricating a semiconductor device according to, e.g. the fourth embodiment.

As described above, according to the present embodiment, when the inter-layer insulation film 26 is planarized, the etching stopper film 24 and the insulation film 20 on the device isolation film 12 are concurrently polished, so that even in a case that the insulation film 20 on the gate electrodes 18 has a disuniform height in the wafer plane, the electrodes 42, 44 can be formed by self-alignment.

[A Sixth Embodiment]

The method for fabricating a semiconductor device according to a sixth embodiment of the present invention will be explained with reference to FIGS. 9A–9C.

Figure 9A:
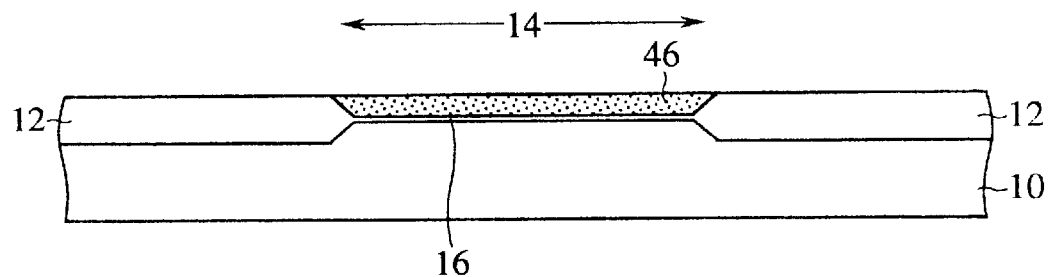
FIGS. 9A–9C are sectional views of a semiconductor device in the steps of the method for fabricating a semiconductor device according to a sixth embodiment of the present invention, which explain the method.
Figure 9B:
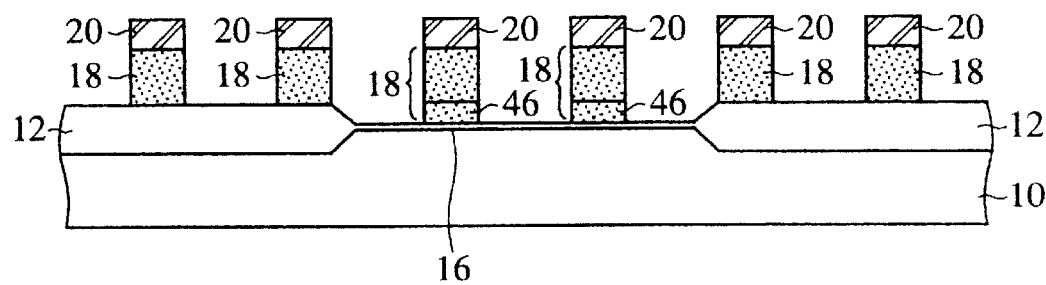
Figure 9C:
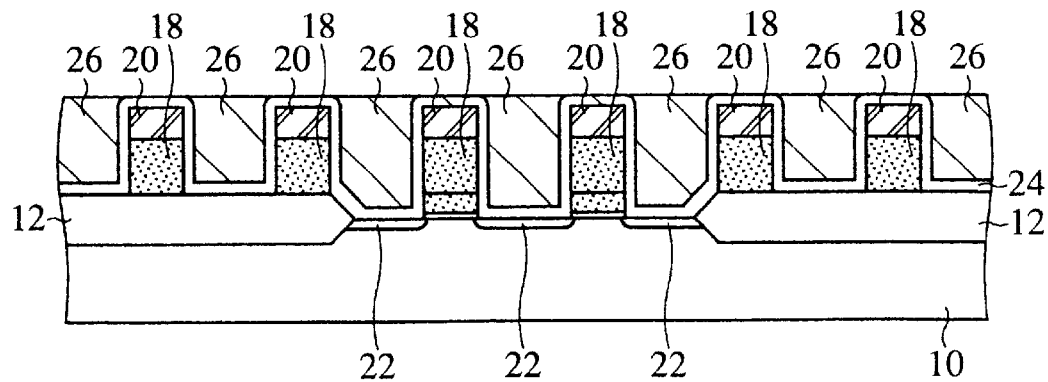

FIGS. 9A–9C are sectional views of a semiconductor device in the steps of the method for fabricating a semiconductor device according to a sixth embodiment, which explain the method.

The method for fabricating a semiconductor device according to the present embodiment is another method which can overcome steps in a device isolation region occurring in the method for fabricating a semiconductor device according to the third and the fourth embodiments.

First an about 200 nm-thick device isolation film 12 is formed on a silicon substrate 10 by, e.g., the usual LOCOS method to define a device region 14.

Then, an about 5 nm-thick gate insulation film 16 is formed by, e.g., thermal oxidation.

Subsequently, a doped polycrystalline silicon film is deposited on the entire surface and polished by CMP until the device isolation film 12 is exposed. Thus the doped polycrystalline silicon film 26 is buried in the device region 14, and the surface of the substrate is planarized (FIG. 9A).

Then, gate electrodes 18 are formed on this substrate. An about 200 nm-thick doped polycrystalline silicon film and a silicon oxide film is continuously deposited by CVD, and then the laminated films are processed in the same pattern by lithography and etching to form the gate electrodes 18 having the upper surfaces covered with an insulation film 20. At this time, the doped polycrystalline silicon film 46 filled in the device region 14 is concurrently patterned.

Thus the gate electrodes 18 having the bottom layer of the doped polycrystalline silicon film 46 are formed in the device region 14 (FIG. 9B). A height of the insulation film 20 on the device isolation film 12 and a height of the insulation film 20 on the device region 14 are made substantially equal to each other by the doped polycrystalline silicon film 46.

Then, an about 50–200 nm-thick silicon nitride film is deposited by, e.g., CVD to form an etching stopper film 24. The etching stopper film 24 is used as a stopper for etching the inter-layer insulation film in a later step, and as sidewall insulation films to be formed on the side walls of the gate electrodes 18.

Subsequently, an insulation film to be the inter-layer insulation film is deposited on the entire surface, and the surface is planarized by, e.g., CMP. At this time, the insulation film is polished with the etching stopper film 24 extended on the gate electrodes 18 as a stopper to expose the etching stopper film 24 extended on the gate electrodes 18 is exposed on the surface. Because the insulation film 20 has a uniform not only in the device isolation region but also in plane, all the etching stopper film 24 on the gate electrodes 18 is exposed, and the surface is planarized.

Then in the same way as in the method for fabricating a semiconductor device according to, e.g., the fourth embodiment, the semiconductor device is fabricated.

As described above, according to the present embodiment, steps of the device isolation film 12 are planarized in advance by the doped polycrystalline silicon film 46, and the gate electrodes 18 having the lowermost layer of the doped polycrystalline silicon are formed in the device region 14, whereby even in a case that the gate electrodes 18 are extended over the device isolation film 12, electrodes 42, 44 can be formed by self-alignment as in the method for fabricating a semiconductor device according to the fourth embodiment.

[A Seventh Embodiment]

The method for fabricating a semiconductor device according to a seventh embodiment of the present invention will be explained with reference to FIGS. 10A–10C.

Figure 10A:
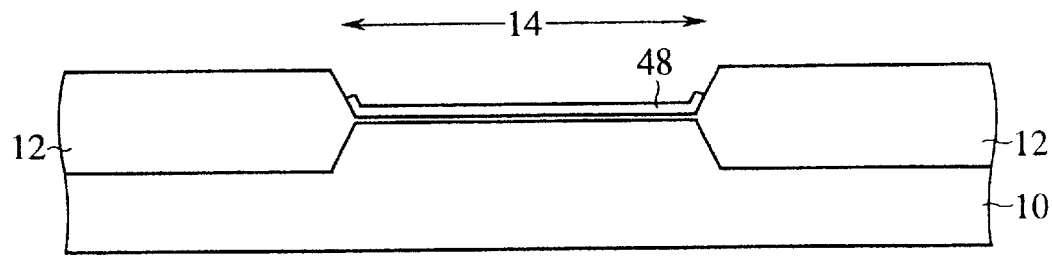
FIGS. 10A–10C are sectional views of a semiconductor device in the steps of the method for fabricating a semiconductor device according to a seventh embodiment of the present invention, which explain the method.
Figure 10B:
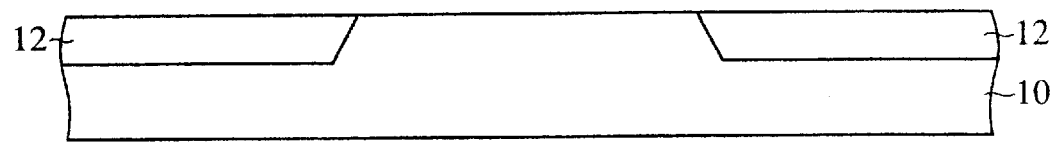
Figure 10C:
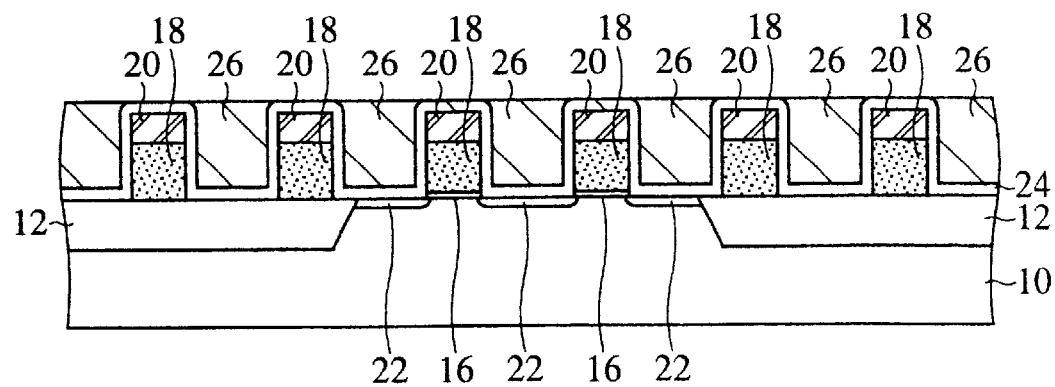

FIGS. 10A–10C are sectional views of a semiconductor device in the steps of the method for fabricating a semiconductor device according to the present embodiment, which explain the method.

The method for fabricating a semiconductor device according to the present embodiment is another method which can overcome steps in a device isolation region occurring in the method for fabricating a semiconductor device according to the third and the fourth embodiments.

First, a device isolation film 12 is formed on a silicon substrate 10 by, e.g., the usual LOCOS method to define a device region 14. The silicon substrate 10 is thermally oxidized with, e.g., a silicon nitride film 48 formed on the silicon substrate 10 through a pad oxide film as an oxidation mask (FIG. 10A).

Then, the device isolation film 12 is polished by CMP with the silicon nitride film used as the oxidation mask as a stopper. Thus, the device region 14 and the top of the device isolation film 12 are substantially planarized (FIG. 10B).

Subsequently, gate electrodes 18 and an etching stopper film 24 are formed in the same way as in the method for fabricating a semiconductor device according to, e.g., the fourth embodiment.

Then, an insulation film to be an inter-layer insulation film 26 is deposited on the entire surface, and the surface of the insulation film is planarized by CMP. At this time, the insulation film is polished by the etching stopper film 24 extended on the gate electrodes 18 as a stopper to expose the etching stopper film 24 extended on the gate electrodes 18 is exposed on the surface. Because the insulation film 20 has a uniform height not only in the region where the device isolation film 12 is formed but also in plane, all the etching stopper film 24 on the gate electrodes 18 is exposed, and the surface is planarized (FIG. 10C).

Then, the semiconductor device is fabricated in the same way as in the method for fabricating a semiconductor device according, e.g., to the fourth embodiment.

As described above, according to the present embodiment, after the device isolation film 12 is polished to make a height of the device region 14 substantially uniform, a MOS transistor is formed, so that even in a case that the gate electrodes 18 are extended over the device isolation film 12, electrodes 42, 44 can be formed by self-alignment in the same way as in the method for fabricating a semiconductor device according to the fourth embodiment.

In the present embodiment, the surface of the silicon substrate 10 is planarized by polishing the device isolation film 12 formed by LOCOS method, but another device isolation may be used.

For example, a trench device isolation in which a groove is formed in a region of the silicon substrate 10 corresponding to the device isolation region, the insulation film is buried in the groove, and the insulation film on the device region 14 is selectively removed, leaving the insulation film only in the groove, whereby a trench device isolation my be used.

[An Eighth Embodiment]

The method for fabricating a semiconductor device according to an eighth embodiment of the present invention will be explained with reference to FIGS. 11A–11C and 12A–12C.

FIGS. 11A–11C and 12A–12C are sectional views of a semiconductor device in the steps of the method for fabricating a semiconductor device, which explain the method.

The method for fabricating a semiconductor device according to present embodiment applies the SAC process in the first to the fourth embodiments to contact process between interconnections.

The method for fabricating a semiconductor device according to the present embodiment is applicable to a case that three-level interconnections are formed with the third-level interconnection layer is connected to the first-level interconnection layer without contact to the second-level interconnection layer.

First, an interconnection 54 having a prescribed pattern is formed on a base substrate 50.

Then, an insulation film is deposited on the interconnection 54, and the surface of the insulation film is planarized as required to form an inter-layer insulation film 56.

Here, the base substrate in the specification includes not only a silicon substrate itself, but also the silicon substrate with a device, such as a transistor, formed on or with one or more interconnection layers formed on. Accordingly, the interconnection 54 may be the first one, the second one or the uppermost one of interconnection layers formed on the silicon substrate.

Figure 11A:
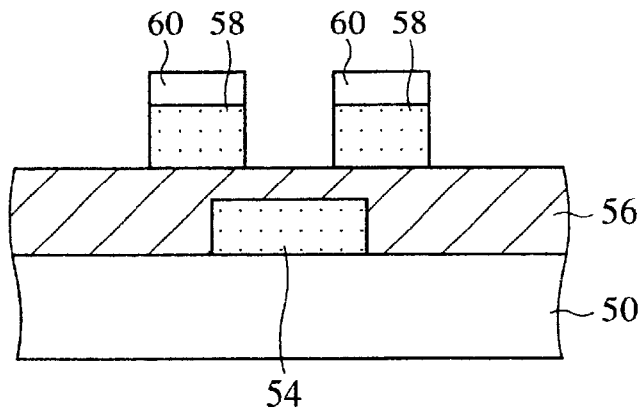
FIGS. 11A–11C are sectional views of a semiconductor device in the steps of the method for fabricating a semiconductor device according to an eighth embodiment of the present invention, which explain the method (Part 1).

Subsequently, a conducting film, and an insulation film of silicon nitride film, alumina film or others, are deposited on the inter-layer insulation film 56, and the laminated film is processed in the same pattern by lithography and etching to form an interconnection 58 having the upper surface covered with an insulation film 60 (FIG. 11A). Preferably the insulation film 60 is formed of a material having different etching characteristics different from those of the inter-layer insulation film 56 because the insulation film 60 is to be used as a mask for etching the inter-layer insulation film 56.

Figure 11B:
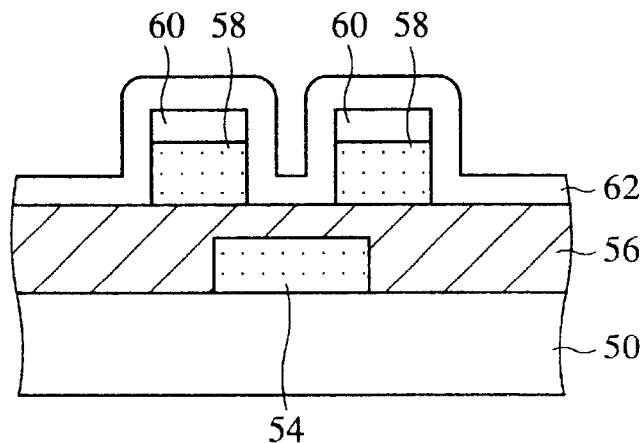
Figure 11C:
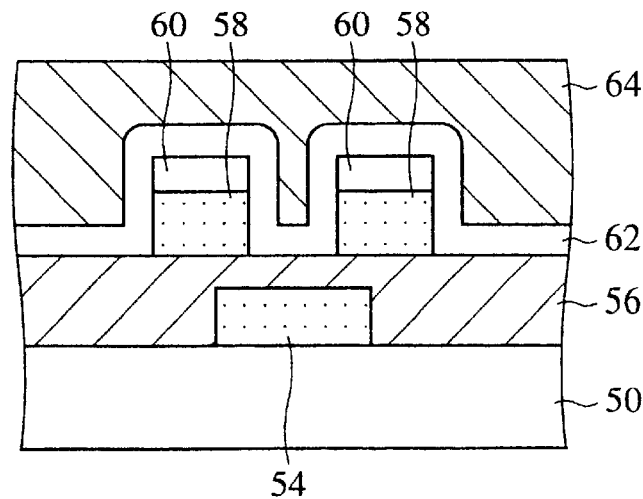

Then, an etching stopper film 62 formed of silicon nitride film is formed by, e.g., CVD (FIG. 11B).

The etching stopper film 62 is to be used as a stopper for etching the inter-layer insulation film in a later step and is to be sidewall insulation films to be formed on the side walls of the interconnection 58. Accordingly the etching stopper film is not essentially formed of silicon nitride film and may be another film, such as alumina film as long as the film can attain the above-described functions.

Then, an insulation film is deposited on the entire surface of the inter-layer insulation film. The insulation film may be an insulation film deposited by CVD or may be SOG.

Subsequently, the surface of the insulation film is planarized to form an inter-layer insulation film 64 having the surface planarized (FIG. 1C). In a case that the insulation film is formed of a film having a low melting point, such as BPSG film, is sued, the surface of the insulation film can have the surface planarized by, e.g., a melting step. The insulation film may have the surface planarized by CMP processing.

In a case that the surface of the insulation film is planarized by CMP, the polishing may be conducted until the etching stopper film 62 is exposed or may be stopped with the surface covered with the inter-layer insulation film 64. In the present embodiment, the case that the inter-layer insulation film 64 remains on the etching stopper film 62 will be explained.

Then, a photoresist 66 having an opening on a region where a contact with the interconnection 54 is to be formed is formed by the usual lithography.

Figure 12A:
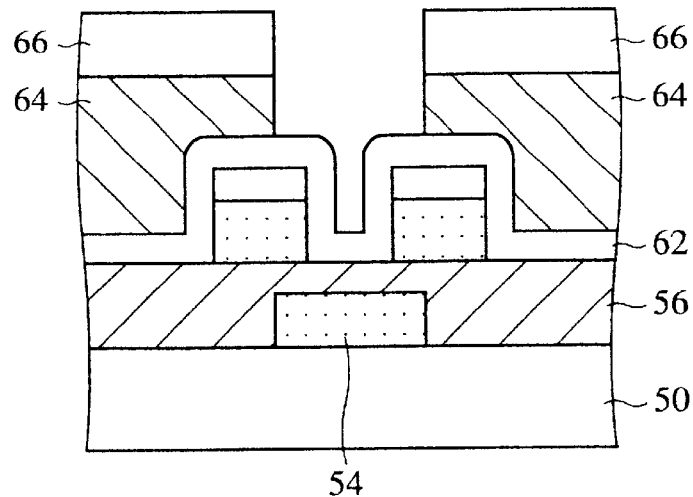
FIGS. 12A–12C are sectional views of a semiconductor device in the steps of the method for fabricating a semiconductor device according to the eighth embodiment of the present invention, which explain the method (Part 2).

Next, with the photoresist 66 as a mask anisotropic etching is conducted to pattern the inter-layer insulation film 64 (FIG. 12A). As the etching conditions, preferably etching conditions which allow a large selective ratio between the inter-layer insulation film 64 and the etching stopper film 62 to enable the etching stopper film 62 to sufficiently function as a stopper.

Figure 12B:
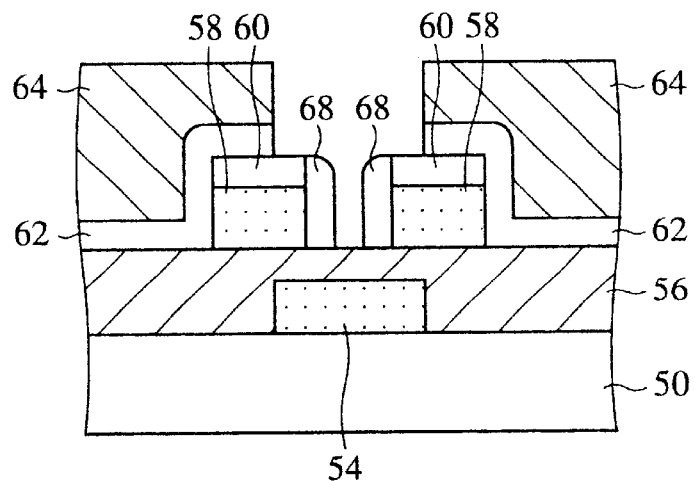
Figure 12C:
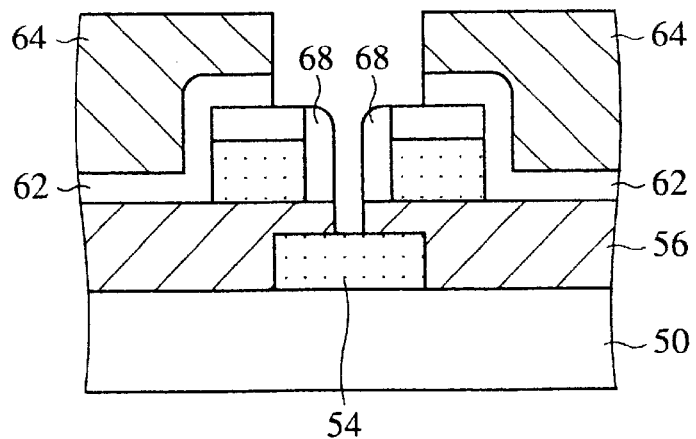

Subsequently, the anisotropic etching is further conducted to pattern the etching stopper film 62 below the inter-layer insulation film 62. Because the etching stopper film 62 is deposited on the side walls of the interconnections 58 and of the insulation film 80, even when the etching goes on until the inter-layer insulation film 56 is exposed, the etching stopper film 62 on the side walls is not removed to remain as sidewall insulation films 68 (FIG. 12B).

Then, with the insulation film 60 and the sidewall insulation films 68 as a mask, the inter-layer insulation film 56 is anisotropically etched to form the contact hole for exposing the interconnection 54. Because the contact hole is formed in alignment with the sidewall insulation films 68, a little disalignment occurs in patterning the photoresist 66, the contact hole arriving at the interconnection 54 can be opened.

As described above, according to the present embodiment, the sidewall insulation films 68 are formed of the etching stopper film 62, even when the interconnections 58 are arranged at a small gap, a contact hole for connecting an interconnection (not shown) formed above the interconnections 58 to the interconnection 54 can be easily opened.

[A Ninth Embodiment]

The method for fabricating a semiconductor device according to a ninth embodiment of the present invention will be explained with reference to FIGS. 13A–13C and 14A–14B. The same members of the method for fabricating a semiconductor device according to the present embodiment as those of the method for fabricating a semiconductor device according to the eighth embodiment are represented by the same reference numbers not to repeat or to simplify their explanation.

FIGS. 13A–13C and 14A–14B are sectional views of a semiconductor device in the steps of the method for fabricating a semiconductor device according to the present embodiment, which explain the method.

The method for fabricating a semiconductor device according to the present embodiment is another method for fabricating a semiconductor device which is applicable to a case that three-level interconnections are formed with the third-level interconnection layer is connected to the first-level interconnection layer without contact to the second-level interconnection layer.

First, an interconnection 54 having a prescribed pattern is formed on a base substrate 50.

Then, an inter-layer insulation film 56 for covering the interconnection is formed.

Figure 13A:
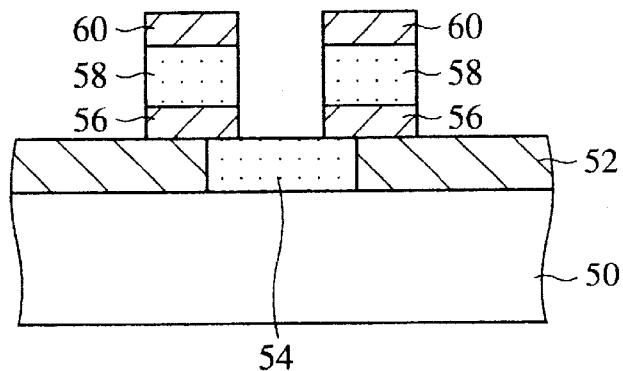
FIGS. 13A–13C are sectional views of a semiconductor device in the steps of the method for fabricating a semiconductor device according to a ninth embodiment of the present invention, which explain the method (Part 1).

Subsequently, a conducting film, and an insulation film of silicon nitride film or alumina film or other are deposited on the inter-layer insulation film 56, and the insulation film, the conducting film and the inter-layer insulation film 56 are processed in the same pattern by lithography and etching. Thus, interconnections 58 having the upper surfaces covered with an insulation film 60 and having the patterned inter-layer insulation film 56 formed below are formed (FIG. 13A).

Figure 13B:
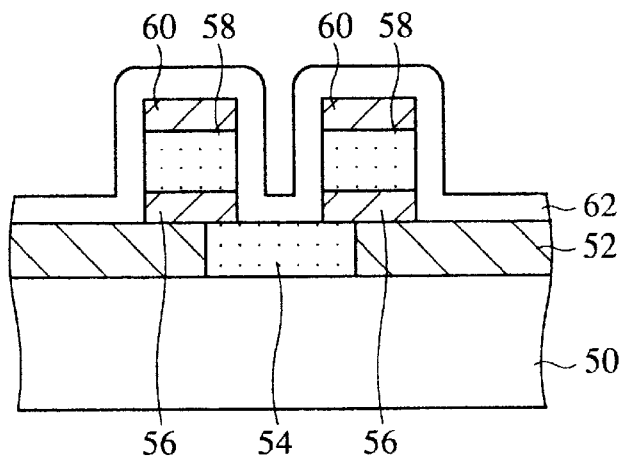

Then, an etching stopper film 62 of silicon nitride film is formed by, e.g., CVD (FIG. 13B).

The etching stopper film 62 is used as a stopper when the inter-layer insulation film is etched in a later step and as sidewall insulation films to be formed on the side walls of the interconnections 58. Accordingly the etching stopper film 62 is not essentially silicon nitride film and can be any film as long as the film does the functions. For example, alumina film or others can be used.

Then, an insulation film to be an inter-layer insulation film is deposited on the entire surface. The insulation film may be deposited by CVD or may be SOG.

Figure 13C:
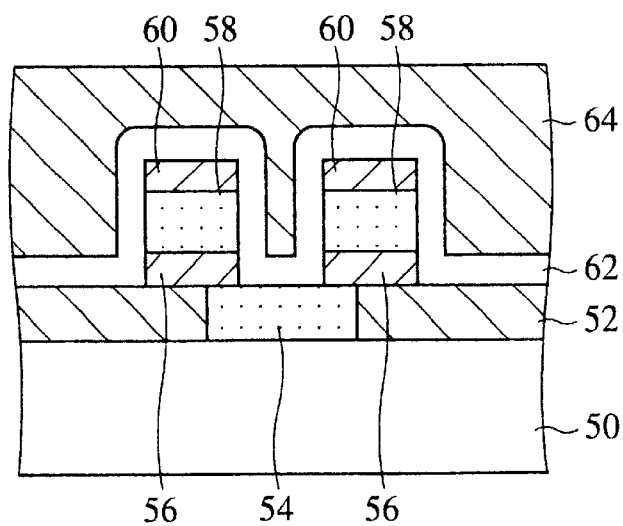

Subsequently, the surface of the insulation film is planarized to form the inter-layer insulation film 64 having the surface planarized (FIG. 13C).

Then, a photoresist 66 having an opening on a region where a contact with the interconnection 54 is formed is formed by the usual lithography.

Figure 14A:
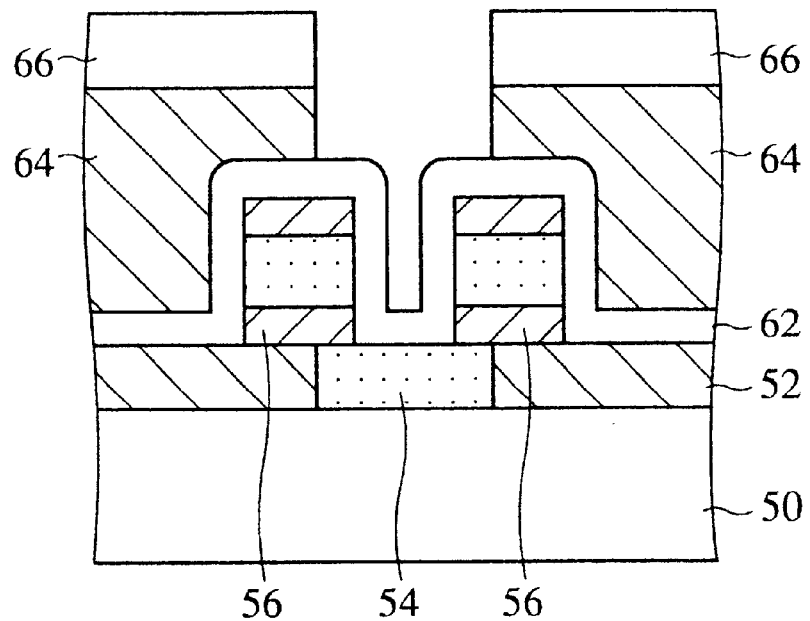
FIGS. 14A and 14B are sectional views of a semiconductor device in the steps of the method for fabricating a semiconductor device according to the ninth embodiment of the present invention, which explain the method (Part 2).
Figure 14B:
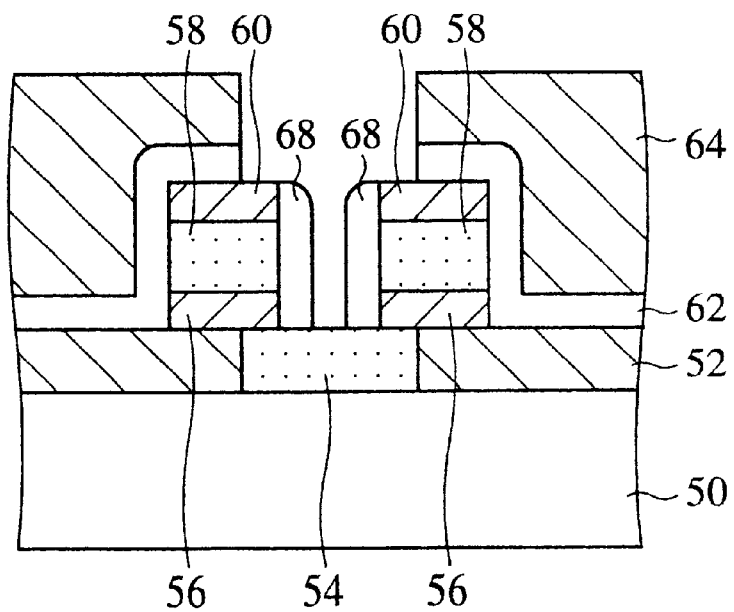

Then, anisotropic etching is conducted with the photoresist 66 as a mask to pattern the inter-layer insulation film 64 (FIG. 14A). As etching conditions, preferably conditions which allow a large selective ratio between the inter-layer insulation film 64 and the etching stopper film 62 to enable the etching stopper film 62 to sufficiently function as a stopper.

Subsequently, the anisotropic etching is further conducted to pattern the etching stopper film 62 below the inter-layer insulation film 64. Because the etching stopper film 62 is formed on the side walls of the interconnection 58 and the insulation film 60, even when the etching goes on until the interconnection 54 is exposed, the etching stopper film 62 on the side walls is not removed and remains as the sidewall insulation films 68.

This etching exposes the interconnection 54 between the interconnections 58, so that the contact hole can be opened by self-alignment by etching the etching stopper film 62.

As described above, according to the present embodiment, the sidewall insulation films 68 are formed of the etching stopper film 62 which is used in opening the contact hole, whereby even in a case that the interconnections 58 are arranged at a narrow gap, the contact hole for connecting the interconnection 54 to the above interconnections can be easily opened.

The etching stopper film and the sidewall insulation films are formed of one and the same film, whereby the film forming steps can be reduced.

The etching step for forming the sidewall insulation films and the step for removing the etching stopper film can be one step, whereby the etching step can be shortened.

This simplification of the fabrication process can attain lower fabrication costs.

[A Tenth Embodiment]

A semiconductor device according to a tenth embodiment of the present invention and the method for fabricating the same will be explained with reference to FIGS. 15, 16A–16C, 17A–17C, 18A–18C, 19A–19D, 20, 21A–21C and 22A–22C.

Figure 15:
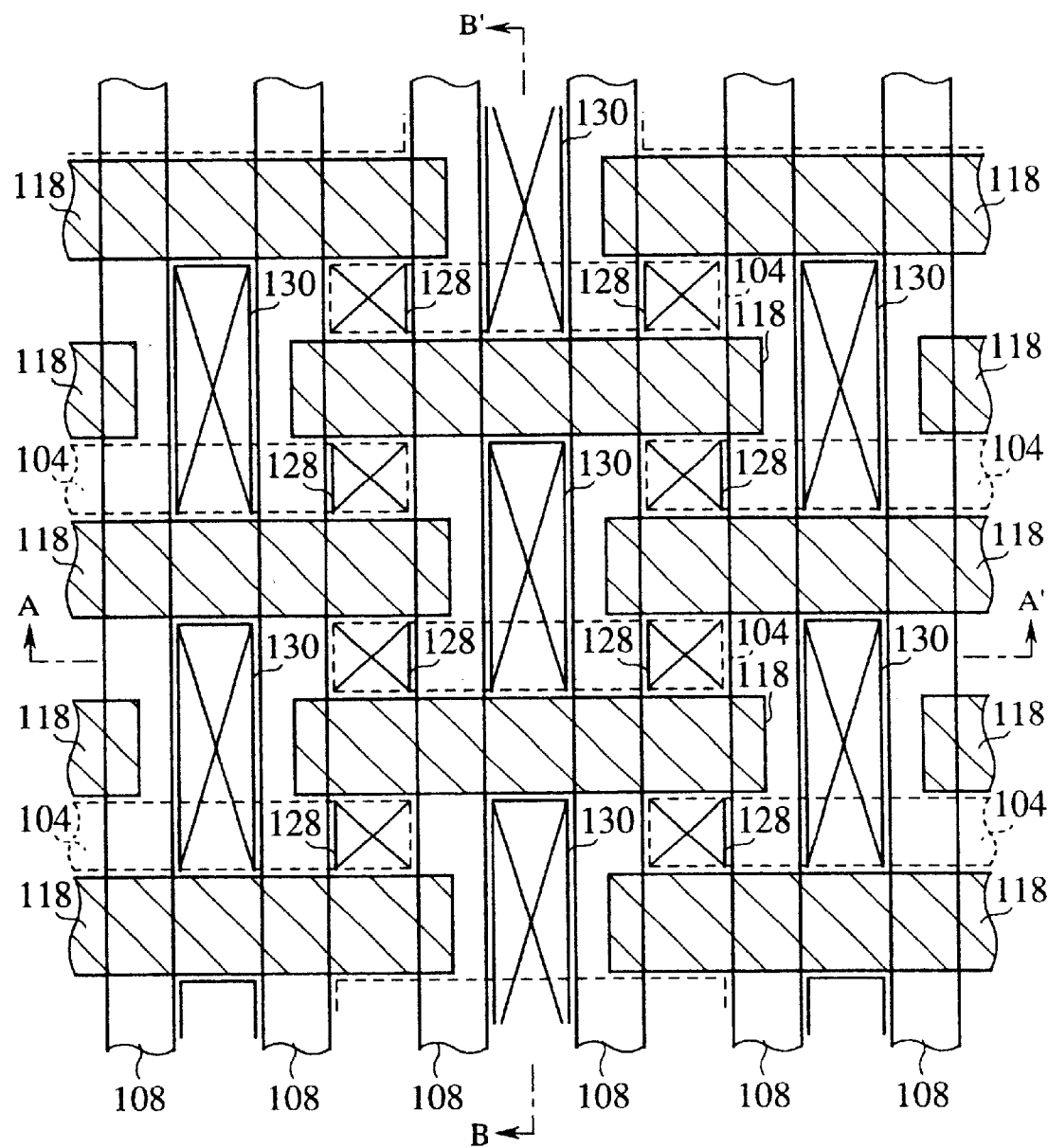
FIG. 15 is a plan view of a semiconductor device fabricated by the method for fabricating a semiconductor device according to a tenth embodiment of the present invention, which explains the method (Part 1).
Figure 19A:
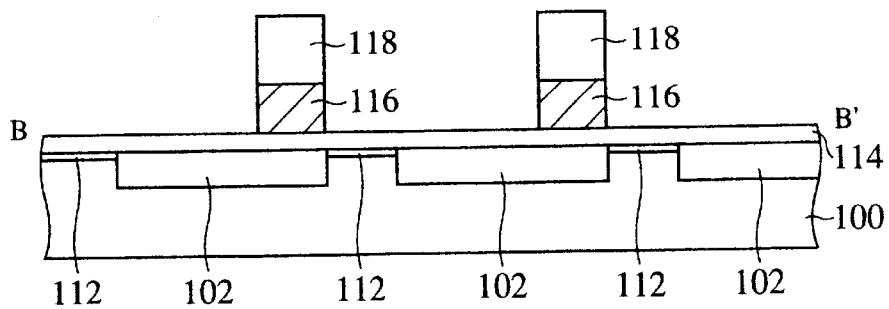
FIGS. 19A–19D are sectional views of the semiconductor device of FIG. 15 along the line B–B' in the steps of the method for fabricating the semiconductor device (Part 2).
Figure 19B:
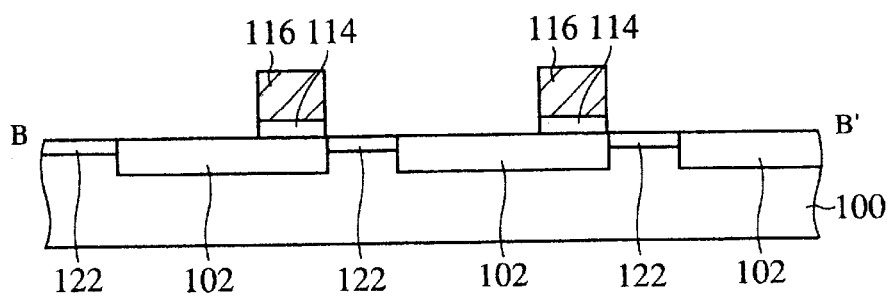
Figure 19C:
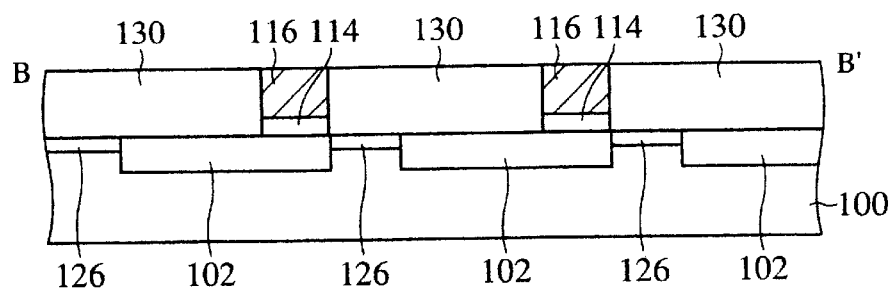
Figure 19D:
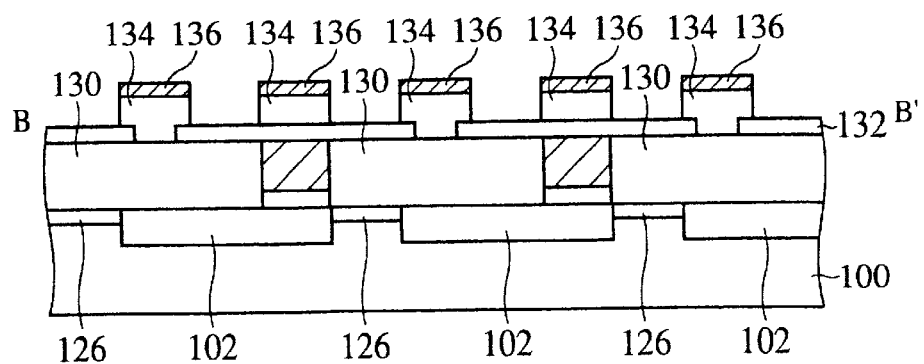
Figure 20:
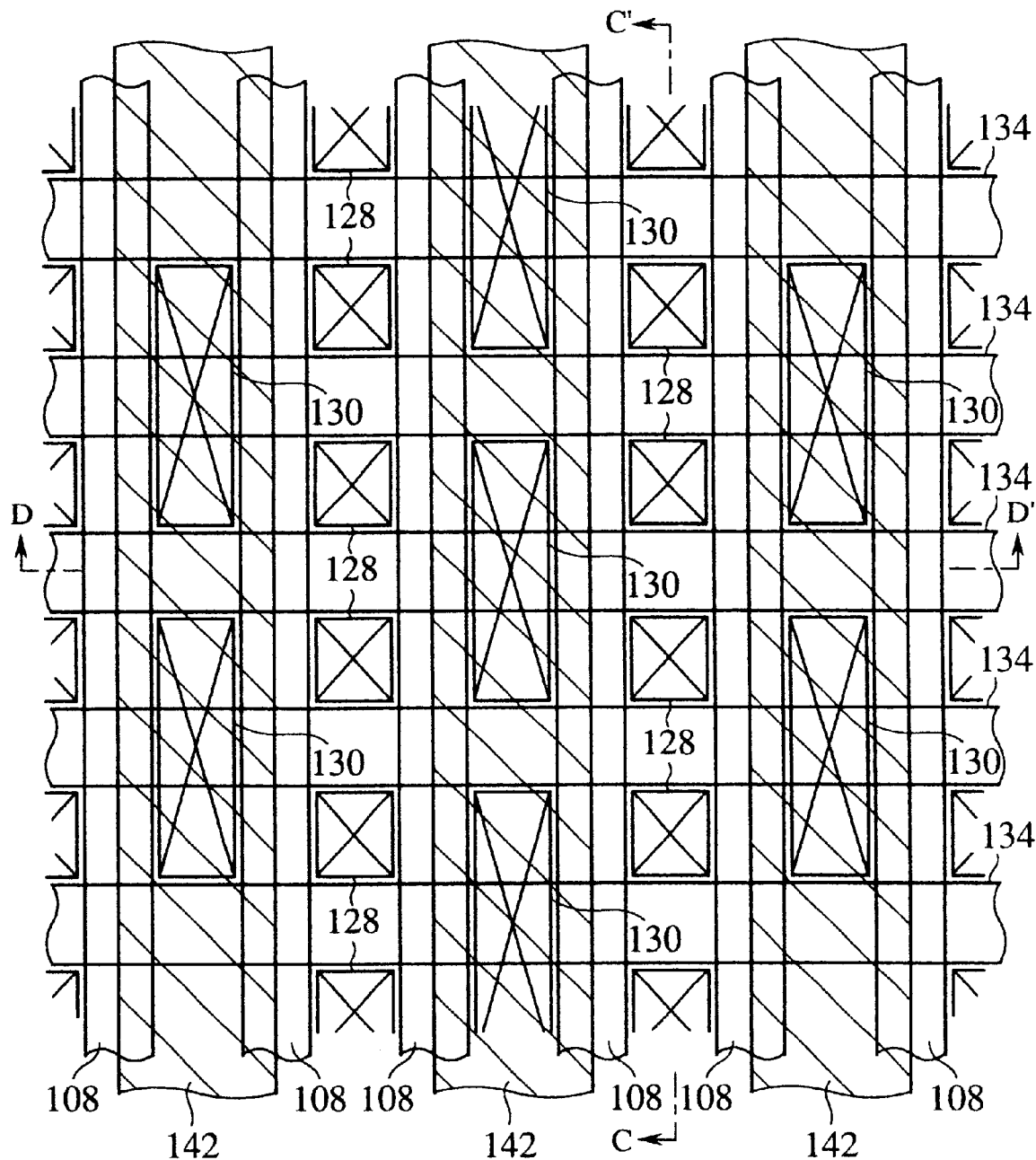
FIG. 20 is a plan view of a semiconductor device fabricated by the method for fabricating a semiconductor device according to the tenth embodiment of the present invention, which explains the method (Part 2).
Figure 21A:
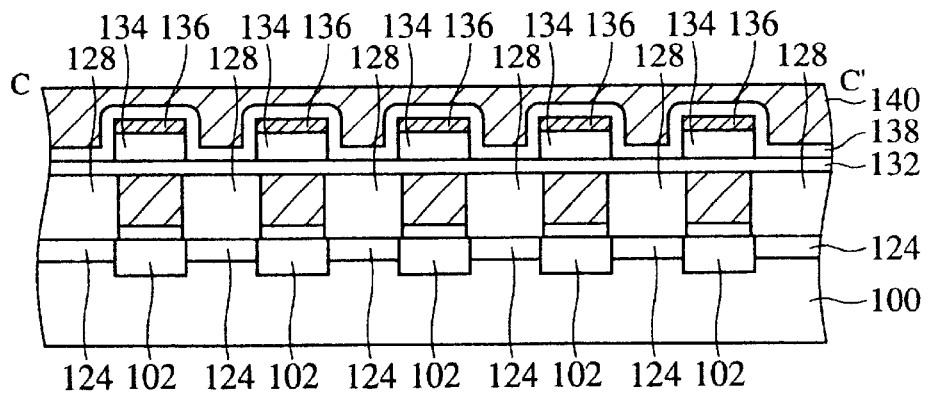
FIGS. 21A–21C are sectional views of the semiconductor device of FIG. 20 along the line C–C' in the steps of the method for fabricating the semiconductor device.
Figure 21B:
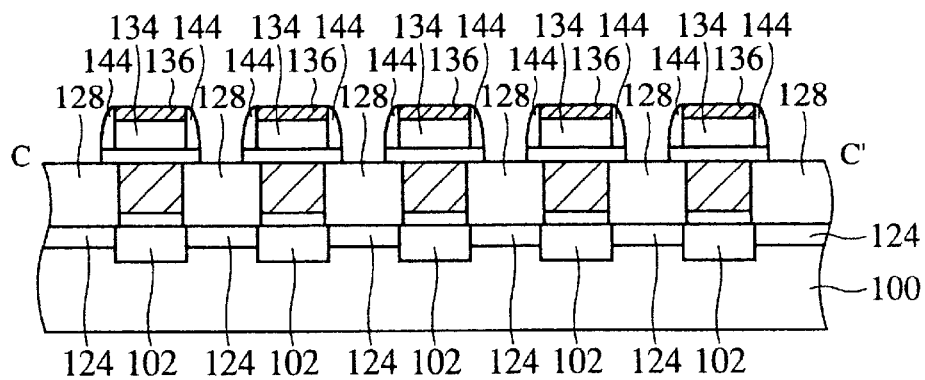
Figure 21C:
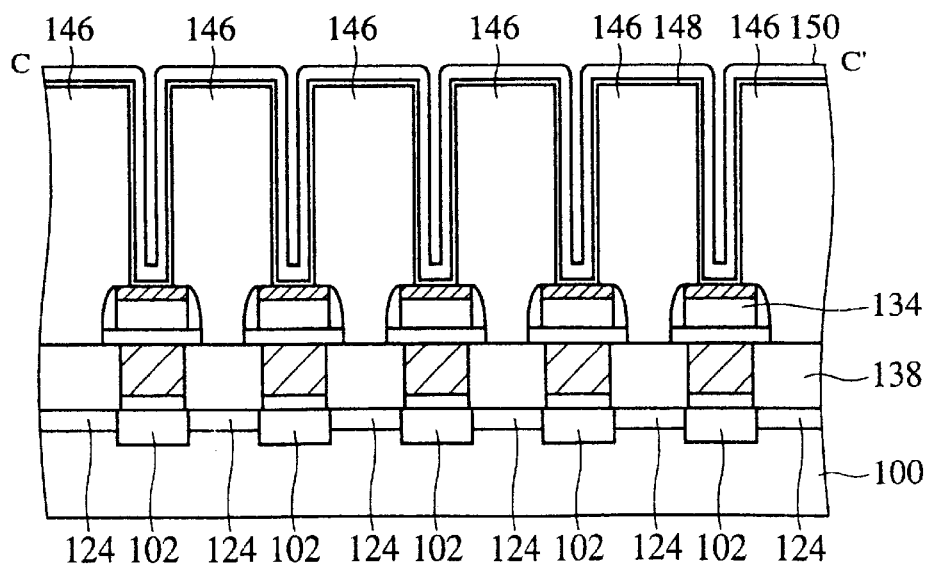
Figure 22A:
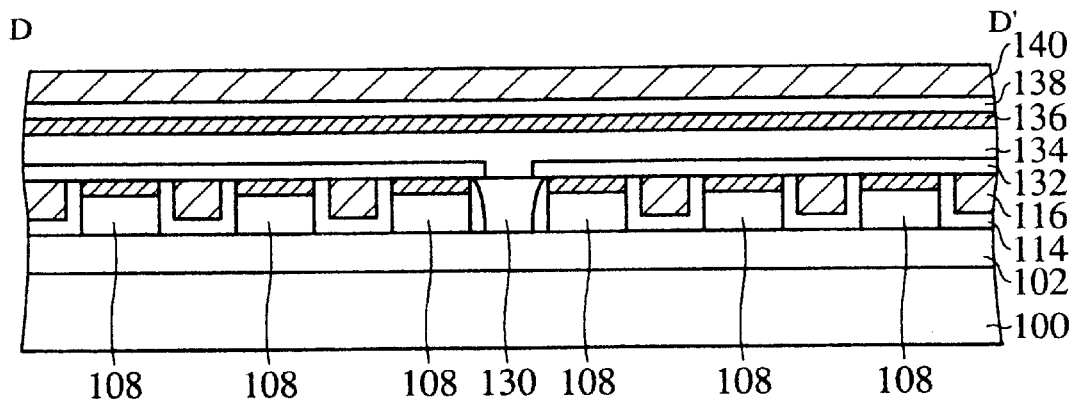
FIGS. 22A–22C are sectional views of the semiconductor device of FIG. 20 along the line D–D' in the steps of the method for fabricating the semiconductor device.
Figure 22B:
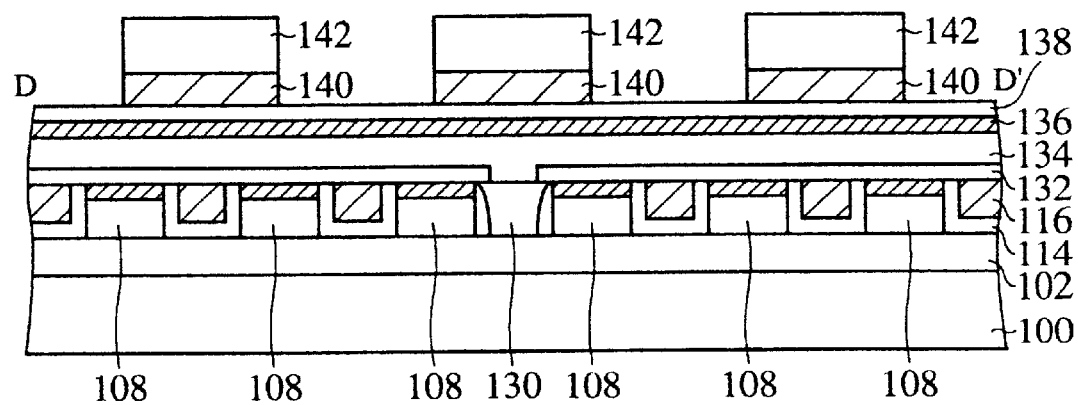
Figure 22C:
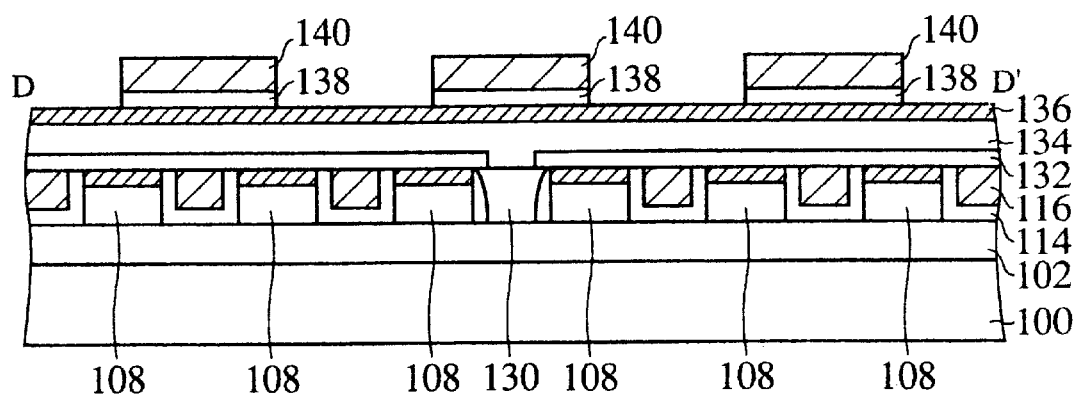

FIGS. 15 and 20 are plan views of the semiconductor device according to the present embodiment. FIGS. 16A–16C and 17A–17C are sectional views of the semiconductor device along the line A–A' in FIG. 15 in the steps of the method for fabricating the same. FIGS. 18A–18C and 19 are sectional views of the semiconductor device along the line B–B' in FIG. 15 in the steps of the method for fabricating the same. FIGS. 21A–21C is sectional views of the semiconductor device along the line C–C' in FIG. 20 in the steps of the method for fabricating the same. FIGS. 22A–22C are sectional views of the semiconductor device along the line D–D' in FIG. 20 in the steps of the method for fabricating the same.

In the present embodiment, a DRAM is fabricated by using the method for fabricating a semiconductor device according to the fourth embodiment is applied to opening contact holes for leading electrodes from a source/drain diffused layer, and the method for fabricating a semiconductor device according to the eighth embodiment is applied to opening a contact hole for a storage electrode.

First, an example of the application of the method for fabricating a semiconductor device according to the fourth embodiment to opening contact holes for leading a bit line from a source/drain diffused layer with reference to FIGS. 15, 16A–16C, 17A–17C, 18A–18C, 19A–19D.

First, a device isolation film 102 is formed on a silicon substrate 100 to define a device region 104. The device regions 104 has a rectangular shape which is lengthy horizontally in FIG. 15 (indicated by the dot lines in the drawing). Two transfer transistors are to be formed in each device region 104.

In the present embodiment, the device isolation film 102 is formed by forming grooves in a silicon substrate 100 and filling an insulation film in the grooves. The so-called trench device isolation is used. The trench device isolation is used not to damage planarization of the substrate surface by the device isolation film 10. In place of the trench device isolation, the method for fabricating a semiconductor device according to, e.g., the fifth to the seventh embodiments may be applied.

Then, a gate insulation film 106 is formed in the device regions 104 by, e.g., thermal oxidation.

Figure 16A:
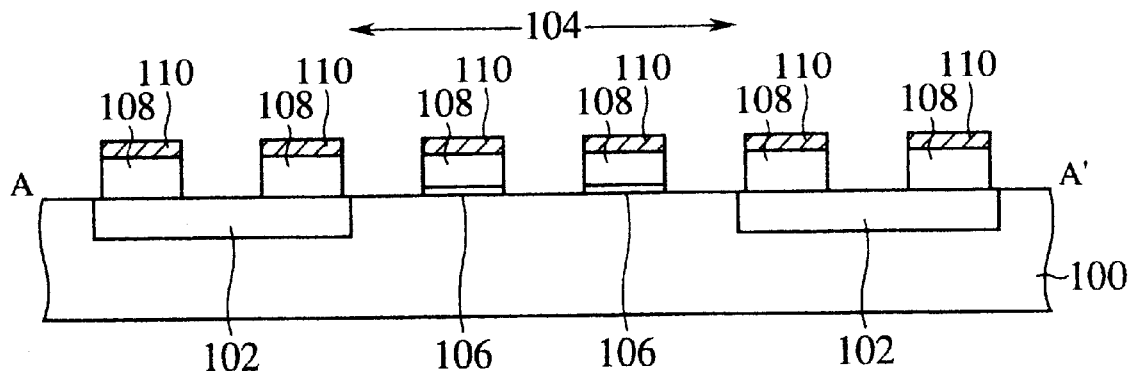
FIGS. 16A–16C are sectional views of the semiconductor device of FIG. 15 along the line A–A' in the steps of the method for fabricating a semiconductor device (Part 1).
Figure 18A:
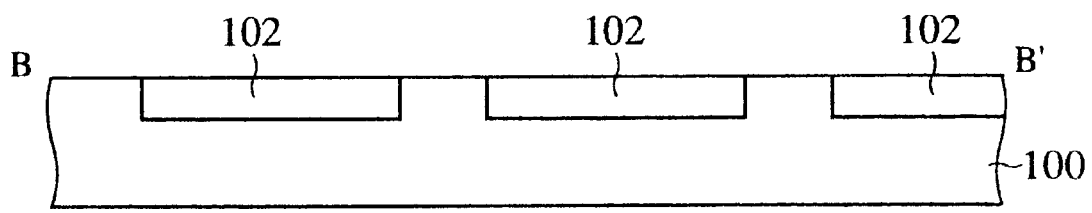
FIGS. 18A–18C are sectional views of the semiconductor device of FIG. 15 along the line B–B' in the steps of the method for fabricating the semiconductor device (Part 1).

Subsequently, a word line 108 is formed, extended normally to the device region 104. A doped polycrystalline silicon film and a silicon oxide film, for example, are continuously deposited by CVD, and the laminated film is processed in the same pattern by lithography and etching to form the word line 108 having the upper surface covered with the insulation film 110 (FIG. 16A, FIG. 18A).

Then, ions are implanted with the word line 108 as a mask to form an impurity doped region 112 which is to be a low-concentration diffused layer of LDD structure in the device region.

Figure 16B:
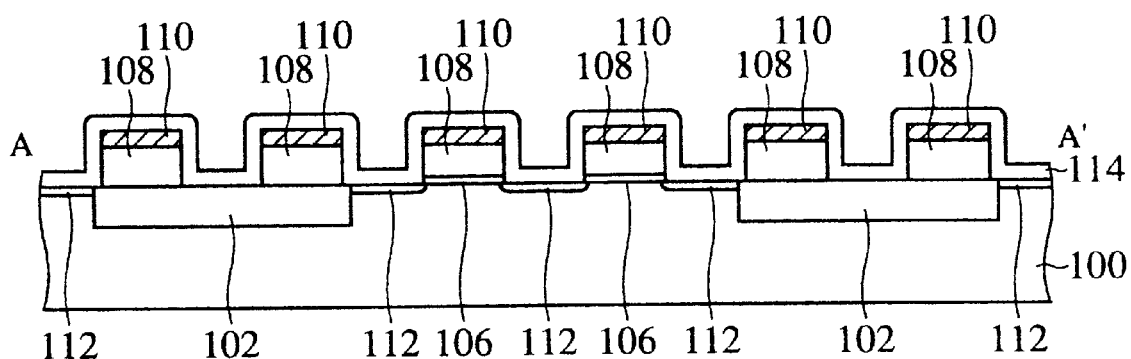
Figure 18B:
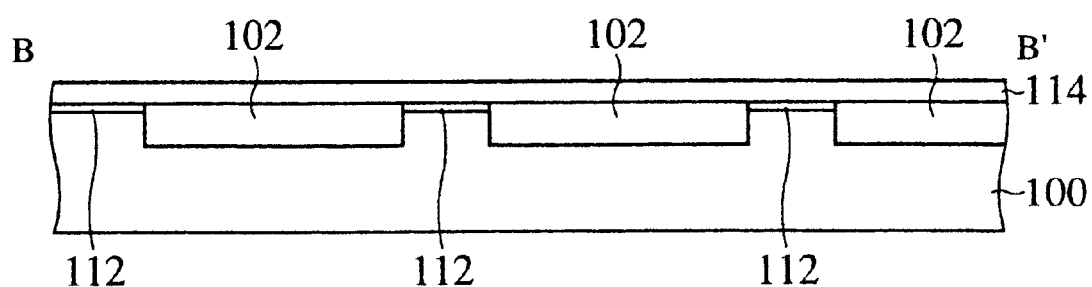

Then, a silicon nitride film is deposited by, e.g., CVD to form an etching stopper film 114 (FIG. 16B, FIG. 18B).

Figure 16C:
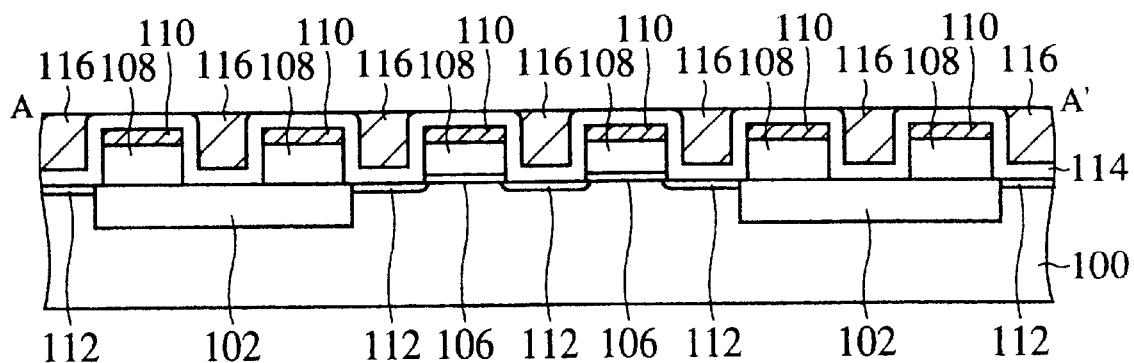
Figure 18C:
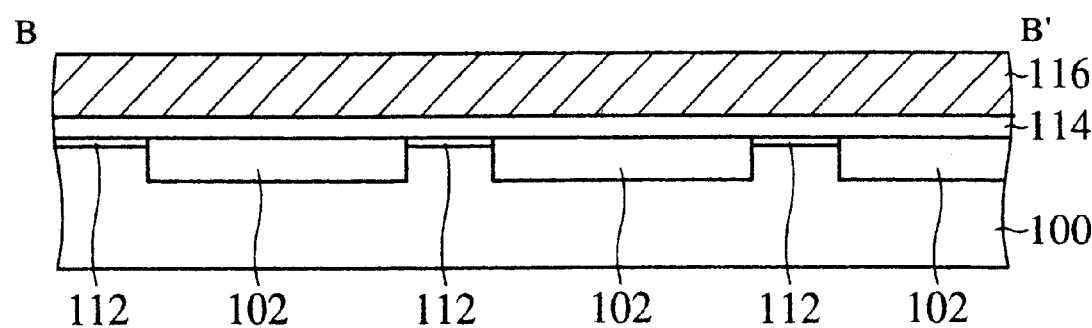

Subsequently, an insulation film is deposited on the entire surface of the etching stopper film 114, and the surface is planarized by CMP. At this time, the insulation film is polished with the etching stopper film 114 extended over the word line 108 as a stopper to expose the etching stopper film 114 extended over the word line 108. Thus the inter-layer insulation film 116 having the surface planarized is formed (FIG. 16C, FIG. 18C).

Then, a photoresist 118 having openings on regions to be the source/drain diffused region by the usual lithography (the shaded regions in FIG. 15).

The method for fabricating a semiconductor device according to the present embodiment is characterized by the plane layout of the photoresist 118 for patterning the inter-layer insulation film 116. That is, the photoresist 118 is formed of a plurality of rectangular islands extended normally to the word lines 108. In relationship of the photoresist 118 with the device regions 104, the photoresist 118 having a pattern of repetition which is substantially equal to repetition of the device regions 104 is arranged, offset by a ¼ period with respect to the device regions 104.

It is necessary that the photoresist 118 covers regions where electrodes are not formed in a later step and where the word lines 108 are not extended. In the present embodiment, because electrodes are formed in the region checked in FIG. 15, the above-described layout is used. By the use of the above-described layout, the openings for exposing the regions for the source/drain diffused layer can be formed by self-alignment with the word lines 108. Accordingly, no pattern for forming micronized contact holes is necessary, which requires less strict patterning rules and facilitates the drawing.

The above-described photoresist pattern is repetition of simple pattern, which further facilitates more micronized lithography.

In the conventional technique, to open a pattern including different sizes and shapes, a plurality of patterns for the respective sizes and shapes are necessary. However, in forming a micronized resist pattern by exposure technique using light, it is preferable that the pattern is repetition of one kind of simple pattern. The use of a simple repeated pattern allows the use of phase shift technique, which much facilitates micronized exposure. In a case of a resist pattern including two kinds of patterns as in the conventional method, the pattern cannot be said to be a repeated simple pattern, which makes it difficult to apply phase shift technique.

As described above, the use of the resist pattern according to the present embodiment further facilitates micronized lithography, which enables micronized processing corresponding to highly integrated devices.

Even in etching the base with this resist pattern as a mask, the etching can be stable with micro-loading effect suppressed. That is, in forming openings of different sizes, the etching varies between the larger openings and the smaller openings. Conditions (process window) for stably forming the openings of both sizes have a narrow range, which makes the processing difficult. The resist pattern according to the present embodiment is a repeated one kind pattern, which enables the etching stable with micro-loading effect suppressed.

Figure 17A:
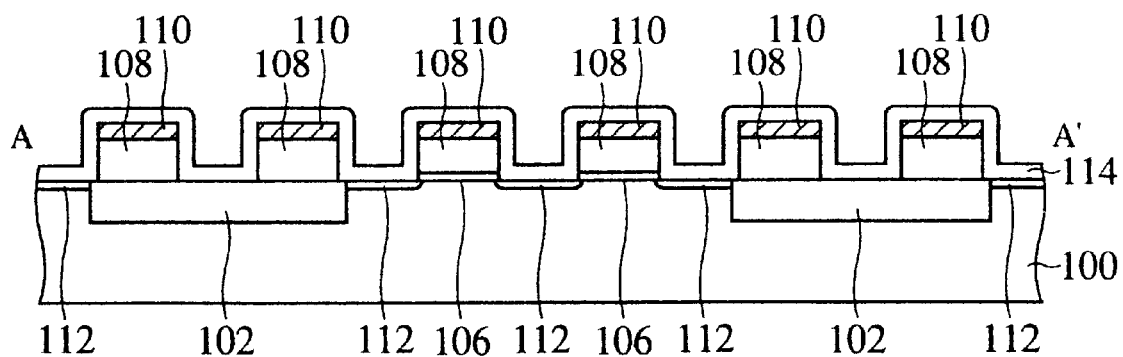
FIGS. 17A–17C are sectional views of the semiconductor device of FIG. 15 along the line A–A' in the steps of the method for fabricating the semiconductor device (Part 2).

Then, anisotropic etching is conducted with the photo resist as a mask to pattern the inter-layer insulation film 116 (FIG. 17A, FIG. 19A).

Subsequently, the photo resist 118 is removed, and the anisotropic etching is further conducted. It is preferable that this etching is conducted under conditions which allows an etching rate of the inter-layer insulation film 116 and that of the etching stopper film 114 substantially equal to each other so as to make heights of the insulation film 110 and the inter-layer insulation film 116 substantially the same.

Because of the etching stopper film 114 deposited on the side walls of the word line 108 and the insulation film 110, when the etching goes on until the silicon substrate 100 is exposed in the device region 104, the etching stopper film 114 on the sidewall insulation films is not removed and remains as sidewall insulation films 120.

Figure 17B:
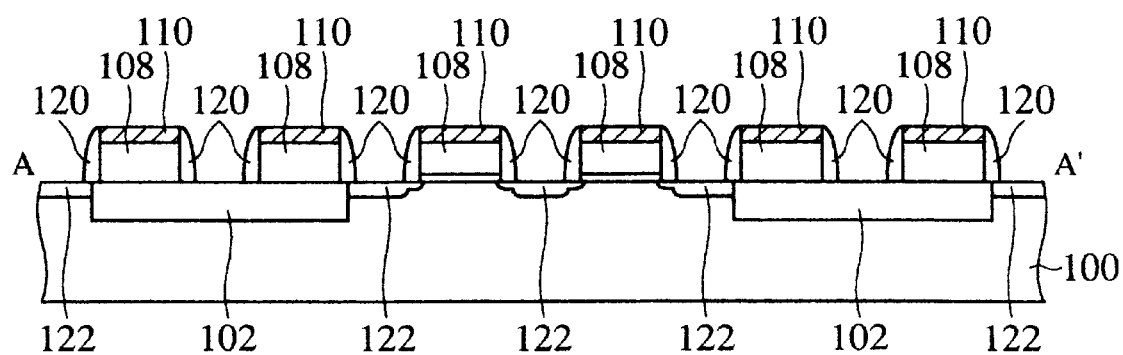

Then, ions are implanted with the word line 108 and the sidewall insulation films 120 as a mask to form an impurity-doped region 122 which is to be a high-concentration diffused layer of LDD structure in the device region. Ions of a Group V element, e.g., As, P or others, and ions of a Group III element, e.g., B or others are implanted in an about $4 \times 10^{15}$ cm$^{-2}$ dose respectively for an n-type transistor and p-type transistor (FIG. 17B, FIG. 19B).

Then, the substrate is thermal-treated under prescribed conditions to make the implanted ions electrically active. The impurity can be activated by rapid thermal annealing of, e.g., 1000° C. for 10 seconds. Thus the source/drain diffused layer 124, 126 is formed in the device region 104.

Figure 17C:
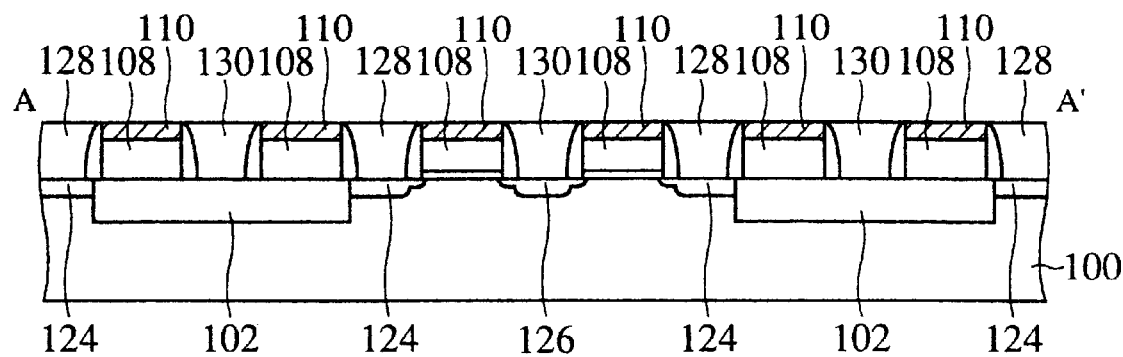

Subsequently, a conducting film to be electrodes is deposited on the entire surface and is left only in the contact holes by CMP or back-etching. Thus an electrode 128 connected to the source/drain diffused layer 124, and an electrode 130 connected to the source/drain diffused layer 126 are formed (FIG. 17C, FIG. 19C).

The electrode 130 functions as an interconnection for connecting the source/drain diffused layer 126 to a bit line and is extended from the source/drain diffused layer 126 over the device isolation film 102 (FIG. 15).

Then, an inter-layer insulation film 132 is deposited and a contact hole for connecting the electrode 130 to the bit line is opened in the inter-layer insulation film 132.

Then, the bit line 134 extended normal to a word line 108 is formed on the inter-layer insulation film 132. The bit line 134 has the upper surface covered with by, e.g., depositing the conducting film to be the bit line and an insulation film of silicon nitride film, alumina film or others and processing the insulation film and the conducting film in the same pattern by lithography and etching. The bit line 134 is connected to the electrode 130 through the contact hole formed in the inter-layer insulation film 132. Thus the bit line 134 connected to the source/drain diffused layer 126 is formed (FIG. 19D).

The insulation film 132 is not essentially formed. Because of the insulation film 132, the electrode 128 and the bit line 134 overlap each other through the opening formed in the insulation film 132 in the plane layout, they dot not short-circuit with each other. Accordingly, the pattern can be dense with higher integration, but in a case where high integration is not required, the insulation film 132 is not necessary.

Then, an example of applying the method for fabricating a semiconductor device according to the eighth embodiment to opening the contact hole for the storage electrode will be explained with reference to FIGS. 20, 21A–21C, 22A–22C and 23A–23C.

Subsequently, a silicon nitride film is deposited by, e.g., CVD to form an etching stopper film 138.

Figure 23A:
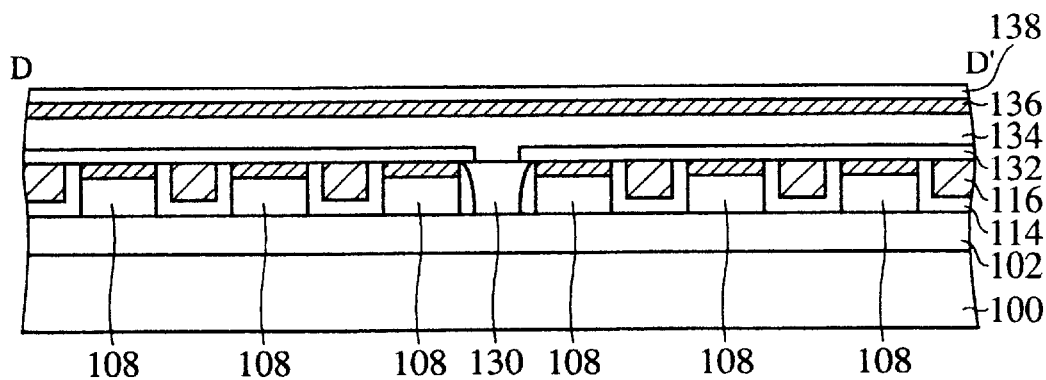
FIGS. 23A–23C are sectional views of the semiconductor device of FIG. 20 along the line D–D' in the steps of the method for fabricating the semiconductor device (modification).
Figure 23B:
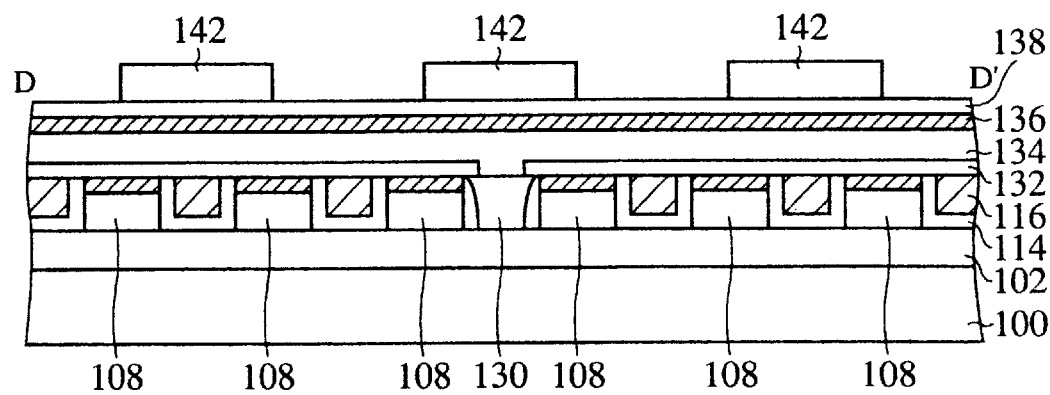
Figure 23C:
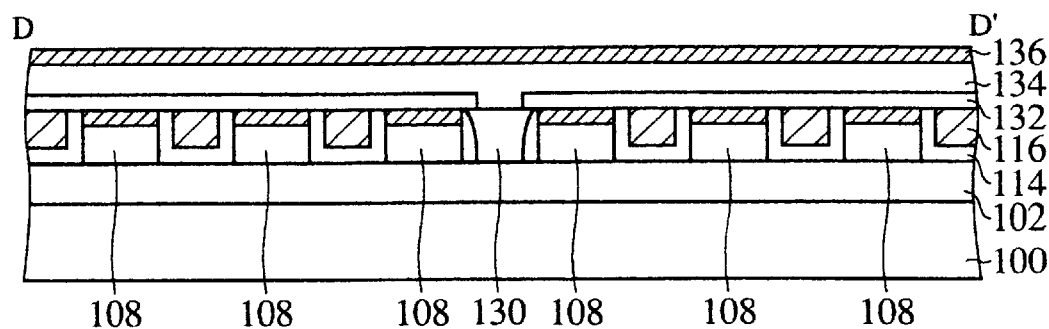
Figure 24A:
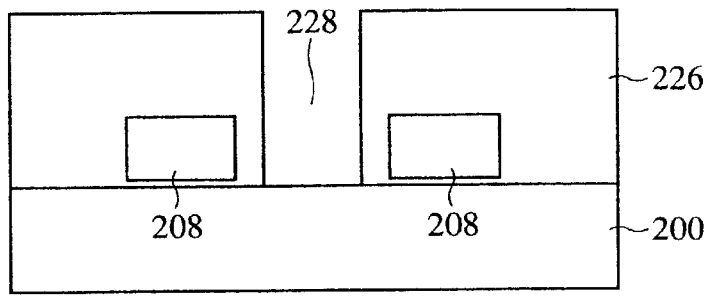
FIGS. 24A–24D are views explaining a conventional semiconductor device having SAC structure.
Figure 24B:
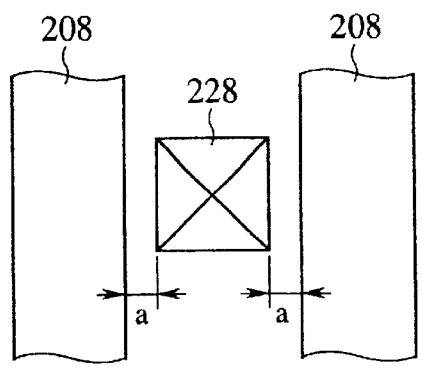
Figure 24C:
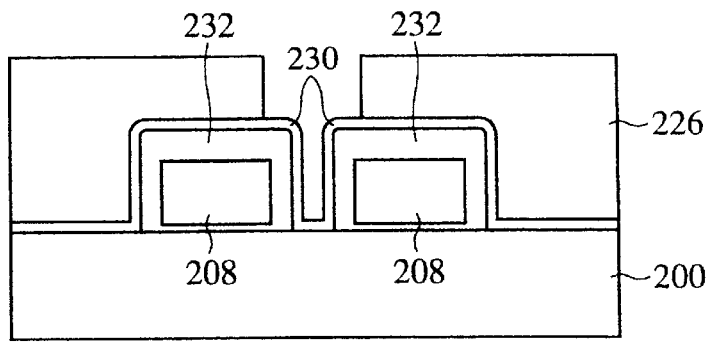
Figure 24D:
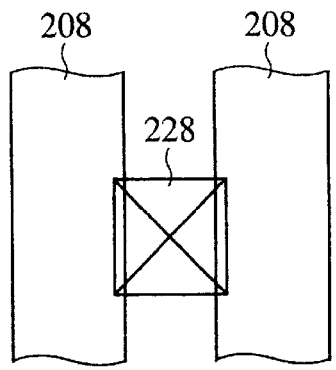

Then, an insulation film to be an inter-layer insulation film is deposited on the entire surface, and the surface is planarized by, e.g., CMP. In the present embodiment, the polishing is stopped before the etching stopper film 138 is exposed, but the polishing may be conducted with the etching stopper film 138 as a stopper. In this case, the resist 142 remains, but the insulation film 140 in FIG. 22A becomes absent, and the insulation film 140 becomes absent in FIG. 22B. In FIG. 22C as well, the insulation film 140 becomes absent, and the etching stopper film 138 as well becomes absent (FIGS. 23A to 23C).

Thus the inter-layer insulation film 140 having the surface planarized is formed (FIG. 21A, FIG. 22A).

Then, a photoresist 142 having openings in regions to be the source/drain diffused layer is formed by the usual lithography (shaded in FIG. 20).

The method for fabricating a semiconductor device according to the present embodiment is characterized in that the plane layout of the photoresist 142 for patterning the inter-layer insulation film 140. That is, the photoresist 142 has a striped pattern extended normally to the word line 108.

It is necessary that the photoresist 142 covers at least a region where no electrode is formed in a later step and where the bit line 134 is not extended. In the present embodiment the above-described layout is used to form a storage electrode connected to the electrode 128. The use of the above-described pattern enables the opening where the electrode 128 is exposed can be opened to be formed by self-alignment. Accordingly no pattern for forming micronized contact holes is necessary, which results in loose pattern rules.

Then, anisotropic etching is conducted with the photoresist 142 as a mask to pattern the inter-layer insulation film 140 (FIG. 22B).

Subsequently, the photoresist 142 is removed, and the anisotropic etching is further conducted to etch the etching stopper film 138. Because the etching stopper film 138 is deposited on the side walls of the bit line 134 and the insulation film 136, the etching stopper film 138 on the side walls is not removed to remain as the sidewall insulation films 144 when the etching progresses until the insulation film 132 is exposed.

Then, with the sidewall insulation films 144 as a mask, the insulation film 132 is anisotropically etched to expose the electrode 128 (FIG. 21B, FIG. 22C).

Then, a capacitor connected to the exposed electrode 128 is formed. The capacitor is formed by, e.g., forming the storage electrode 146 projected on the electrode 128 and forming a dielectric film 148 and an opposed electrode 150 (FIG. 21C). The storage electrode 146 is connected to the source/drain diffused layer 124 through the electrode 128.

Thus, a DRAM whose unit cell is 1L transistor and 1 capacitor is formed.

As described above, according to the present embodiment, SAC process according to the first to the ninth embodiment is applied for opening the contact hole for leading the bit line from the source/drain diffused layer and the contact hole for leading the storage electrode from the source/drain diffused layer, whereby the fabrication process of a DRAM cell can be simple. Especially, it is not necessary to transfer micronized contact holes in opening the contact holes in the inter-layer insulation film, which is very effective to simplify the lithography step.

In the present embodiment, the method for fabricating a semiconductor device according to the fourth and the eighth embodiments are applied, but the method for fabricating a semiconductor device according to other embodiments can be applied to the same methods for fabricating a DRAM as described above.

In the above-described embodiments, the method for fabricating a semiconductor is applied to a method for fabricating a DRAM, but application of the present invention is not limited to the method for fabricating a DRAM and is widely applicable to methods for fabricating semiconductor devices SAC structure is applicable to.

Selected materials and processing conditions used in the structures of the semiconductor device, and the method for fabricating the same according to the first to the tenth embodiments are not limited to those described in the present specification.

For example, a material of the gate electrodes is not limited to doped polycrystalline silicon film and may be silicide film, polycide film, a metal film or other conducting film.

In the above-described embodiments, the method for fabricating a semiconductor device is explained by means of n-type transistors but is applicable to p-type transistors as well.

What is claimed is:

1. A method for fabricating a semiconductor device comprising the steps of:

forming a device isolation film on a semiconductor substrate to define a plurality of device regions extended in a first direction and arranged in a staggered layout;

forming a plurality of word lines having surfaces covered with a first insulation film and extended in a second direction intersecting the first direction, two of the word lines being extended in each of the device regions;

depositing a second insulation film on the semiconductor substrate with the word lines formed on;

planarizing the second insulation film until the first insulation film on the word lines is exposed;

forming on the second insulation film a resist pattern for covering regions which are arranged in a staggered layout, the respective regions being between the device regions extended in the first direction, and being on one side of the respective device regions; and etching the second insulation film with the resist pattern as a mask to form first contact holes extended in the second direction and opened on regions which are between the adjacent two word lines intersecting the same device regions other than the regions where the resist pattern is formed, and second contact holes opened on the respective device regions between the adjacent two word lines intersecting the different device regions.

2. A method for fabricating a semiconductor device according to claim 1, further comprising the steps of:

etching the first insulation film in the first contact holes and second contact holes to form sidewall insulation films of the first insulation film on side walls of the word lines.

3. A method for fabricating a semiconductor device comprising the steps of:

forming a device isolation film on a semiconductor substrate to define a plurality of device regions extended in a first direction and arranged in a staggered layout;

forming a plurality of word lines having upper surfaces covered with a first insulation film and extended in a second direction intersecting the first direction, two of the word lines being extended in each of the device regions;

sequentially depositing a second insulation film and a third insulation film on the semiconductor substrate with the word lines formed on;

planarizing the third insulation film until the second insulation film on the word lines is exposed;

forming on the third insulation film a resist pattern for covering regions which are arranged in a staggered layout, the respective regions being between the device regions extended in the first direction, and being on one side of the respective device regions;

etching the third insulation film with the resist pattern as a mask to form first openings extended in the second direction and opened on regions which are between the adjacent two word lines intersecting the same device regions other than the regions where the resist pattern is formed, and second openings opened on the respective device regions between the adjacent two word lines intersecting the different device regions; and etching the second insulation film in the first openings and the second openings to form sidewall insulation films of the second insulation film on side walls of the word lines and to form contact holes to be connected to the semiconductor substrate in alignment with the word lines.

4. A method for fabricating a semiconductor device according to claim 3, further comprising, after the step of depositing the second and the third insulation film, the step of:

planarizing the third insulation film.

5. A method for fabricating a semiconductor device comprising the steps of:

forming a plurality of word lines extended in a first direction on a semiconductor substrate;

depositing a first insulation film on the semiconductor substrate with the word lines formed on;

forming a plurality of bit lines having upper surfaces covered with a second insulation film and extended in a second direction intersecting the first direction on the first insulation film;

subsequently depositing a third insulation film and a fourth insulation film on the first insulation film with the bit lines formed on;

forming a striped resist pattern for alternately covering regions between the word lines on the fourth insulation film;

etching the fourth insulation film with the resist pattern as a mask to open a plurality of openings in regions between the bit lines; and etching the third insulation film in the openings to form sidewall insulation films of the third insulation film on side walls of the bit lines and open contact holes in alignment with the bit lines.

6. A method for fabricating a semiconductor device according to claim 5, further comprising, after the step of depositing the second and the third insulation film, the step of:

planarizing the third insulation film.

7. A method for fabricating a semiconductor device according to claim 5, further comprising, after the step of etching the third insulation film, the step of:

etching the first insulation film in the openings to open the contact holes to the semiconductor substrate.

8. A method for fabricating a semiconductor device comprising the steps of:

forming a device isolation film on a semiconductor substrate to define a device region;

forming an interconnection on the device region;

forming a first insulation film covering the side walls and an upper surface of the first interconnection;

forming a second insulation film on the device region and the first interconnection;

planarizing the second insulation film until the first insulation film on the interconnection is exposed; and selectively etching the second insulation film to form an opening formed in a region including the device region, the opening being formed over the interconnection and extending over two contact regions in the device region, said two contact regions being adjacent to each other sandwiching the interconnection therebetween.

9. A method for fabricating a semiconductor device comprising the steps of:

forming a device isolation film on a semiconductor substrate to define a device region;

forming two interconnections on the device region;

forming a first insulation film covering side walls and upper surfaces of said two interconnections;

forming a second insulation film on the device region and said two interconnections;

planarizing the second insulation film until the first insulation film on said two interconnections is exposed; and selectively etching the second insulation film to form an opening formed in a region including the device region, the opening being formed over said two interconnections and extending over three contact regions in the device region, one of said three contact regions being between said two interconnections, the others of said three contact regions being adjacent to said one contact region sandwiching either of said two interconnections therebetween.

10. A method for fabricating a semiconductor device comprising the steps of:

forming a plurality of word lines extended in a first direction on a semiconductor substrate;

depositing a first insulation film on the semiconductor substrate with the word lines formed on;

forming a plurality of bit lines having surfaces covered with a second insulation film and extended in a second direction intersecting the first direction on the first insulation film;

depositing a third insulation film on the first insulation film with the bit lines formed on;

forming a striped resist pattern for alternately covering regions between the word lines on the third insulation film;

etching the third insulation film with the resist patterns as a mask to open a plurality of contact holes in regions between the bit lines.

11. A method for fabricating a semiconductor device according to claim 10, further comprising the steps of;

etching the second insulation film in the contact holes to form sidewall insulation films of the second insulation film on the side walls of the bit lines.

* * * * *